United States Patent
Sato et al.

(10) Patent No.: US 7,657,853 B2
(45) Date of Patent: Feb. 2, 2010

(54) VERIFICATION APPARATUS, DESIGN VERIFICATION METHOD, AND COMPUTER AIDED DESIGN APPARATUS

(75) Inventors: Mitsuru Sato, Kawasaki (JP); Takehiro Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 416 days.

(21) Appl. No.: 11/589,170

(22) Filed: Oct. 30, 2006

(65) Prior Publication Data

US 2008/0005708 A1    Jan. 3, 2008

(30) Foreign Application Priority Data

Jun. 28, 2006 (JP) ............... 2006-177437

(51) Int. Cl.
*G06F 17/50* (2006.01)

(52) U.S. Cl. ......................................... 716/5

(58) Field of Classification Search .................. 716/1–5, 716/10–12
See application file for complete search history.

(56) References Cited

U.S. PATENT DOCUMENTS

2006/0075372 A1*    4/2006    Gryba ..................... 716/11

FOREIGN PATENT DOCUMENTS

JP        2001-101245        4/2001

* cited by examiner

*Primary Examiner*—Paul Dinh
(74) *Attorney, Agent, or Firm*—Staas & Halsey LLP

(57) ABSTRACT

According to the present invention, in a CAD apparatus, circuit data for a circuit diagram created through circuit design processing is stored in a circuit database. Based on the circuit data stored in the circuit database, the respective logic types of components are discriminated and set for the component in the circuit data. Moreover, by adding logically transparent nets to the circuit data stored in the circuit database, DRC data dedicated to a DRC is created and stored in a DRC database. A DRC execution unit performs the DRC, by utilizing the DRC data stored in the DRC database.

4 Claims, 20 Drawing Sheets

VERIFICATION APPARATUS, DESIGN VERIFICATION METHOD, AND COMPUTER AIDED DESIGN APPARATUS

CROSS-REFERENCE TO RELATED APPLICATION

This application claims priority from Japanese patent application Serial no. 2006-177437 filed Jun. 28, 2006, the contents of which are incorporated by reference herein.

BACKGROUND OF THE INVENTION

1. Field of the Invention

The present invention relates to a technique for design verification performed in developing an electronic circuit such as a printed circuit board. The present invention relates particularly to a design verification apparatus, a design verification program, a design verification method, and a CAD (computer aided design) apparatus that, by preparing data for design verification, enable the processing time for the design verification to be reduced.

2. Description of the Related Art

FIG. 19 is a chart illustrating the development flow for a printed circuit board. The development work for an electronic circuit such as a printed circuit board is performed in accordance with sequential steps, e.g., specification design (P10), circuit design (P12), mounting design (P14), analysis (P15), and trial board production (P16).

The specification design (P10) is a process of determining a specification including a system requirement that specifies functions to be realized, a component configuration, an operating frequency, a bus configuration, and the like and production conditions that specify arrangement restriction, the number of layers, and the like. A specification is a document in which specifications determined in the specification design (P10) are described.

Floor planning/analyses (P11 and P13) are processes in which limiting conditions for the circuit design (P12) and the mounting design (P14) are studied and created. Depending on the results of the floor planning/analyses (P11 and P13), the specifications themselves are modified. The limiting conditions (design-restriction DB) are restrictions, such as arrangement positions for components, the wiring lengths of net lines, wiring spacing, and the number of bypass capacitors, on the circuit design (P12) and the mounting design (P14); the limiting conditions are created in the specification design (P10) and the floor planning/analyses (P11 and P13) so that no problem is posed when printed circuit boards are produced.

In the Floor planning/analyses (P11 and P13), an actual layer configuration, a component arrangement, and a wiring pattern are created, as limiting conditions on designing, based on the specifications determined in the specification design (P10). In addition, by utilizing the created limiting conditions, an analysis, e.g., of a power-source noise is performed. Based on the analysis, it is verified that no problem is posed in producing printed circuit boards; if any problem exists, the limiting conditions are reviewed and modified. The circuit design (P12) and the mounting design (P14) are performed in accordance with the limiting conditions that, as described above, have been modified, while being verified, so as to prevent any problem from occurring. As a result, at the early stage of the development, the occurrence of problems can be prevented that, to date, have been found later in the production of printed circuit boards.

The circuit design (P12) is a design process of connecting by means of net lines a plurality of components such as ICs, resistors, and capacitors, power sources, and the ground with one another so that the functions of a system are realized. A net list is data for circuits that are created in the circuit design (P12). The net list includes constituent elements of a printed circuit board, such as components, power sources, and the ground, and information on connection between the constituent elements.

The mounting design (P14) is a design process in which actual arrangement and wiring on the substrate are performed by utilizing the data created in the circuit design (P12). Layout data is created in the mounting design (P14). In addition to the information in the net list, the layout data includes the actual shapes of components and nets and information about the positions of the constituent elements on a printed circuit board.

The analysis (P15) is a process in which whether or not any production problem is posed is analyzed by utilizing the layout data. Basically, the analysis (P15) is the same as what are performed in the floor planning/analyses (P11 and P13); however, the accuracy of the analysis (P15) is higher than those of the floor planning/analyses (P11 and P13), owing to the layout data. CAM (Computer Aided Manufacturing) data is conveyed to the production line of a factory and with which an actual printed circuit board is produced; the CAM data is converted from the layout data.

The trial board production (P16) is a process in which a prototype of the printed circuit board is produced. An actual-equipment test on the prototyped printed circuit board is performed; when no problem is posed, actual production (mass production) of the printed circuit board is started.

FIG. 20 is a diagram illustrating a configuration example of a CAD apparatus. In the circuit design (p12) in the development flow represented in FIG. 19, the designer of a printed circuit board performs circuit design, by utilizing an application for the circuit design. A CAD apparatus 110 includes a component library 111, a circuit-design processing unit 112, a circuit database 113, and a DRC execution unit 114.

In response to the designer's manipulation of an input/output device 120, the circuit-design processing unit 112 performs circuit design processing. By manipulating the input/output device 120, the designer selects components to be used from the component library 111 and inputs the components to a circuit diagram. The component library 111 is a library of components to be utilized in a circuit. The circuit database 113 is a database for storing the circuit data for the circuit diagram that is created by the designer. The created (or in process of creation) circuit diagram is outputted to and displayed on the input/output device 120.

The DRC execution unit 114 is incorporated in a design verification unit 115 of the CAD apparatus 110 and executes a DRC (Design Rule Check) on the designed circuit diagram (the circuit data stored in the circuit database 113). Verification work is required in which, after the completion of the circuit design, the authenticity of the circuit (whether the circuit complies with the design criteria) is verified. For the verification, a scheme is utilized that is referred to as a DRC and in which the authenticity of a circuit is automatically checked based on a design rule.

The verification items to be checked are roughly divided into a drawing check for pointing out errors in the notation of a circuit diagram and a logic check for pointing out errors in the logical configuration of a circuit. In the drawing check, whether or not any error in the notation of a circuit diagram exists is checked, i.e., a check on cross wire connection, a check on component arrangement outside the drawing frame, a check on overlap of a character and a component, and the like are checked. In the logic check, whether or not any error in the logical configuration of a circuit exists is checked, i.e., a check on whether or not any unconnected power-source pin exists, a check on whether or not a case exists in which no input pin or output pin exists in a net, a check on dot logic (a case where one input pin is driven by way of a plurality of output pins), and the like are checked.

After executing the DRC, the DRC execution unit 114 reports to the designer the positions where the foregoing rule is not complied with. When any error is pointed out, the designer modifies the circuit diagram, in accordance with the report on the result of the DRC execution.

In addition, in the case where, through the logic check, the authenticity of the logical configuration of a circuit is verified, it may be considered that a component whose input and output logically take the same value, e.g., whose input-pin signal and output-pin signal are equal, does not exist. Components that are logically transparent, as described above, are referred to as logically transparent components.

The logically transparent components include, e.g., a dumping resistor, and a coupling capacitor. A resistor that is not connected to either of the power source and the ground, but connected between the nets of ordinary signals is referred to as a dumping resistor. A capacitor is a component that accumulates electricity therein, and only from that point of view, it may be utilized simply in place of a battery; however, in an electronic circuit, capacitors are scarcely utilized for that purpose. A capacitor is conductive for AC current and nonconductive for DC current, in nature; therefore, it is utilized in the case where the electric potentials at both sides differ from each other and it is required to transfer only AC current. A capacitor that is utilized for that application is referred to as a coupling capacitor.

To date, a designer has manually inputted these logical types (a dumping resistor, a coupling capacitor, and the like) of components to the CAD apparatus 110.

In addition, a component logical type signifies the logical type into which the component is classified in accordance with the in-circuit properties of the component. Additionally, a component type signifies the type of the component itself. For example, components whose component type is "resistor" are logically classified in line with roles in a circuit, e.g., into a "dumping resistor", a "pull-up resistor", and a "pull-down resistor" that are the component logical types.

FIG. 21 is a diagram illustrating a configuration example of circuit data. Circuit data stored in the circuit database 113 consists of four data tables, i.e., a circuit diagram table 130, a component table 131, a component pin table 132, and a net table 133. The respective data tables are linked with one another in such a way as to correspond to the circuit configuration. The mark "*" in FIG. 21 stands for one or more pieces.

The circuit diagram table 130 is a data table for managing information on the whole circuit diagram. The circuit diagram table 130 is created for each circuit diagram. The circuit diagram table 130 is linked with a plurality of the component tables 131 and a plurality of the net tables 133.

The component pin table 131 is a data table for managing information on components included in a circuit diagram. When the designer adds a component to a circuit diagram, a single component table 131 is added. The component table 131 is linked with a plurality of the component pin tables 132.

The component table 132 is a table for managing information on a plurality of component pins of each component. The component pin table 132 is linked with the parent component table 131 and the connected net table 133. The case never takes place in which a single component belongs to a plurality of parents. Additionally, the number of component pins that each component has is defined in the component library 111 and the designer cannot alter in the circuit design. When a component is added to a circuit diagram, the component pin tables 132 are automatically created; the number of the component pin tables 132 is the same as that of pins of the component.

The net table 133 is a data table for managing information on nets included in a circuit diagram. When the designer adds a net to a circuit diagram, the single net table 133 is added. The net table 133 is linked with the connected component pin tables 132.

FIG. 22 is a diagram illustrating an example of a circuit diagram. In the circuit diagram (sample) in FIG. 22, a component A has a component pin PA; a component B has a component pin PB; a component R has component pins PR1 and PR2; a component C has component pins PC1 and PC2. A net N1 connects the component pin PA and the component pin PR1; a net N2 connects the component pin PR2 and the component pin PC1; a net N3 connects the component pin PC2 and the component pin PB. In FIG. 22, it is assumed that the components R and C are a resistor and a capacitor, respectively, to be considered as a logically transparent component.

FIG. 23 is a diagram illustrating an example of the structure of a database for a circuit diagram. FIG. 23 is a database structure that represents the circuit diagram (sample) illustrated in FIG. 22. In the case where, with regard to logical connection of the circuit diagram illustrated in FIG. 22, the link from the component pin PA to the component pin PB is obtained, it is required to access the database in accordance with the following procedure:

Procedure 1: the link from the component pin PA of the component A to the net N1 is obtained;

Procedure 2: the link from the net N1 to the component pin PR1 is obtained;

Procedure 3: the link from the component pin PR1 to the component R is obtained;

Procedure 4: the link from the component R to the component pin PR2 is obtained, because the component R is a logically transparent component (resistor);

Procedure 5: the link from the component pin PR2 to the Net N2 is obtained;

Procedure 6: the link from the Net N2 to the component pin PC1 is obtained;

Procedure 7: the link from the component pin PC1 to the component C is obtained;

Procedure 8: the link from the component C to the component pin PC2 is obtained, because the component C is a logically transparent component (capacitor);

Procedure 9: the link from the component pin PC2 to the net N3 is obtained; and

Procedure 10: the link from the net N3 to the component pin PB is obtained.

FIG. 24 is a flowchart illustrating logic check processing carried out by the DRC execution unit. The logic check processing carried out by the DRC execution unit 114 differs depending on the contents to be checked. Here, as an example, processing will be explained in which whether or not any input pin exists in component pins connected to one net is checked. In this processing, when no input pin exists in component pins connected to one net, "error" is outputted. This kind of connection may suggest that the circuit is not normal. It is assumed that, before the start of the processing, respective processed flags for the tables are set to the initial setting values "OFF".

In the first place, all nets are obtained from the circuit diagram (Step S100). In other words, all the net tables 133 that are linked with the circuit diagram table 130 are obtained. Hereinafter, it is assumed that, similarly, the processing is carried out by utilizing information on the tables.

When no unprocessed (processed flag=OFF) net exists in the nets obtained in Step S100 (Step S101), the processing is ended.

When any unprocessed (processed flag=OFF) net exists in the nets obtained in Step S100 (Step S101), one unprocessed net is selected (Step S102), component-pin searching processing described later is carried out (Step S103), and a component pin list is created. The component pin list is a list for the component pins that are considered to be logically connected to the same net when the search is executed, while logically transparent components are logically penetrated.

When no input pin exists in the component pin list created through the component-pin searching processing (Step S104), the error information on the net selected in Step S102 is outputted (Step S105). The processing in Step S101 is resumed. The error information outputted in Step S105 is, for example, an error message such as "the net (name) is not connected to any input pin".

FIG. 25 is a flowchart illustrating the component-pin searching processing. With a net considered as an input, the component-pin searching processing is carries out.

In the first place, all component pins connected to the obtained (or selected) net are obtained (Step S10). In other words, all the component pin tables 132 that are linked with the net table 133 are obtained. In addition, the processed flag of the obtained (or selected) net is set to ON (Step S111).

When no unprocessed (processed flag=OFF) component pin exists in the component pins obtained in Step S110 (Step S112), the processing is ended.

When any unprocessed (processed flag=OFF) component pin exists in the component pins obtained in Step S110 (Step S112), one unprocessed component pin is selected (Step S113) and the processed flag of the component pin selected in Step S113 is set to ON (Step S114).

When the parent component of the component pin selected in Step S113 is a logically transparent component (Step S115), the component pin, of the parent component, opposite to the component pin selected in Step S113 is obtained (Step S116). Next, the processed flag of the component pin obtained in Step S116 is set to ON (Step S117). A net connected to the component pin obtained in Step S116 is obtained (Step S118), and the component-pin searching processing is recursively carried out (Step S119). The processing in Step S112 is resumed. In addition, whether or not a component is a logically transparent component is determined based on the component logical type and the like.

When the parent component of the component pin selected in Step S113 is not a logically transparent component (Step S115), the component pin selected in Step S113 is stored in the component pin list (Step S120). The processing in Step S112 is resumed.

The literatures in which a prior art related to circuit verification is described are exemplified by, for example, Patent Document 1. Patent Document 1 discloses a technique for reducing the processing time for analogue simulation of delayed computation in the mounting design of a large-scale semiconductor integrated circuit (LSI).

(Patent Document 1: Japanese Patent Laid-Open No. 2001-101245)

To date, in the case where, in the application of circuit design, the DRC is carried out, circuit data stored in the circuit database 113 has been utilized. However, it has been a problem that, when the circuit diagram becomes large-scale, the number of components and nets increases, whereby it takes a long processing time to perform the DRC. Generally, in the DRC, several dozen to several hundreds, or more, kinds of checks are performed; therefore, if, each time the check is carried out, the circuit configuration is referred to in accordance with the procedure explained utilizing FIGS. 22 and 23 as an example, massive processing time, in proportion to the circuit scale, is consumed.

Moreover, it has been required that the component logical types that, in the DRC, is necessary for detecting logically transparent components are manually inputted by a designer; therefore, in the case where the number of components is large, the DRC has been a cause of increase in work amount of the designer. If the logical types of components related to the logical transparency are not correctly set, erroneous results are outputted through the DRC. Accordingly, it has been a problem that errors inherent in the design and pseudo errors caused by mistaken setting or insufficient setting of component logical types are intermingled, whereby it takes long time to sort the causes and to address the problem.

In addition, the technique disclosed in Patent Document 1 does not have an object of reducing the processing time for design criteria verification (DRC) in circuit design of a printed circuit board (PCB). In general, in the PCB circuit design, the analogue simulation of the delayed computation is not performed. That is because information which is to be included in the layout data, such as the positional information on components and conducting wires, necessary for the delayed computation of conducting wires is not provided. In summary, the technique disclosed in Patent Document 1 cannot be applied to the circuit design data.

Node information, which is supposed to be unnecessary for the analogue simulation of delayed computation, is required for the design criteria verification (DRC) in the circuit design of a printed circuit board (PCB); therefore, because, provided the technique disclosed in Patent Document 1 is utilized, even necessary data may be reduced, the application of the technique is not practical. Because the DRC has nothing to do with electric current paths, data cannot be reduced by the current-path-search parasitic capacitance aggregation means and the specific wiring parasitic resistance extraction means disclosed in Patent Document 1.

SUMMARY OF THE INVENTION

It is an object of the present invention to provide a technique that solves the foregoing problems and enables DRC processing time to be reduced. In addition, it is an object of the present invention to provide a technique that, by reducing designer's time and trouble of manually inputting component logical types, reduces DRC pseudo errors caused by mistaken setting or insufficient setting of the component logical types.

The present invention is characterized in that, based on data for a designed circuit, DRC data (design-verification data) is preliminarily created in which the concept of a logically transparent net is introduced, and then a DRC is performed by utilizing the DRC data; in the concept of a logically transparent net, a logically transparent component is passed through and component pins necessary for a logic check are connected with each other. As a result, it is not necessary to detect a logically transparent component each time a DRC is performed; therefore, DRC processing time can significantly be reduced.

Moreover, the present invention is characterized in that, based on circuit data, such as the type, the connection configuration, and the arrangement position of a component, the logical type of the component is automatically obtained, and the obtained logic type is set in the data for the component. As a result, it is possible to reduce designer's time and trouble of manually inputting component logical types, thereby reducing DRC pseudo errors caused by mistaken setting or insufficient setting of the logical types.

Specifically, the present invention provides a design verification apparatus for performing design verification of a circuit diagram designed by utilizing circuit data that is data for the designed circuit diagram; the design verification apparatus includes a determination unit for, by searching a second component to be connected to a first component in a circuit diagram, based on information obtained from circuit data, determining whether or not the second component is a logically transparent component whose input and output are identical in value, and when the second component is a logically transparent component, further searching a component to be connected to the second component, creating data, on a logically transparent net, that is information on a net in which components other than the logically transparent components are connected with one another and then creating design-verification data that is obtained by adding the data on a logically transparent net to the circuit data; a storage unit for storing the design-verification data; and a verification unit for performing design verification, by utilizing design-verification data stored in the storage unit and tracing components connected to the logically transparent net.

Moreover, the present invention provides the design verification apparatus further including a setting unit for, by utilizing the information obtained from circuit data, discriminating at least component logical types, of part of or all of components arranged in a designed circuit diagram, that are utilized for determining whether or not the components are the logically transparent components, based on the connection configurations of the components and component types in the circuit diagram, and for automatically setting the obtained logic types in the data for the respective components in the circuit data.

Still moreover, the present invention provides a computer aided design (CAD) apparatus for supporting a designer to design a circuit diagram; the CAD apparatus includes a unit for creating a circuit diagram, in accordance with instructions of a designer; a unit for storing circuit data for the created circuit diagram; means for, by searching a second component to be connected to a first component in a circuit diagram, based on information obtained from circuit data, determining whether or not the second component is a logically transparent component whose input and output are identical in value, and when the second component is a logically transparent component, further searching a component to be connected to the second component, creating data, on a logically transparent net, that is information on a net in which components other than the logically transparent components are connected with one another and then creating design-verification data that is obtained by adding the data on a logically transparent net to the circuit data; design-verification data storing means for storing the design-verification data; and a unit for performing design verification, by utilizing design-verification data stored in the design-verification data storing means and tracing components connected to the logically transparent net.

The present invention makes it unnecessary to detect a logically transparent component each time a DRC is performed; therefore, DRC processing time can significantly be reduced. Additionally, the present invention enables the logic types of part of or all of components to be automatically set; therefore, it is possible to reduce designer's time and trouble of manually inputting the logical types of the components, thereby reducing DRC pseudo errors caused by mistaken setting or insufficient setting of the logical types.

DETAILED DESCRIPTION OF THE PREFERRED EMBODIMENTS

Figure 1:
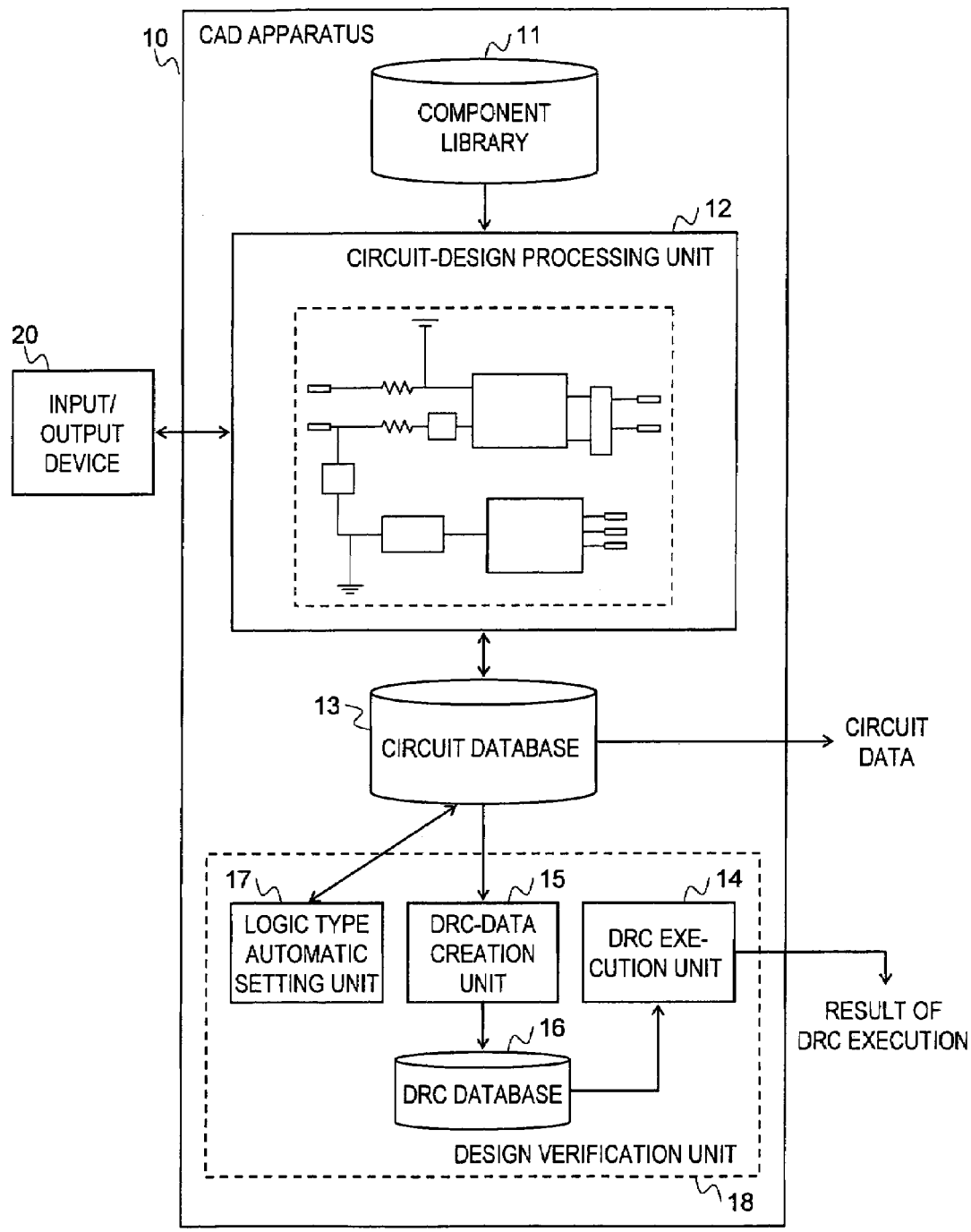
FIG. 1 is a diagram illustrating a configuration example of a CAD apparatus according to an embodiment of the present invention.

FIG. 1 is a diagram illustrating a configuration example of a CAD apparatus according to an embodiment of the present invention. A CAD apparatus 10 includes a component library 11, a circuit-design processing unit 12, a circuit database 13, a DRC execution unit 14, a DRC-data creation unit 15, a DRC database 16 and a logic type automatic setting unit 17. The DRC execution unit 14, the DRC-data creation unit 15, the DRC database 16 and the logic type automatic setting unit 17 configure a design verification unit 18 of the CAD apparatus 10 according to the present embodiment.

In response to the designer's manipulation of an input/output device 20, the circuit-design processing unit 12 carries out the processing for circuit design. By manipulating the input/output device 20, the designer selects components to be used from the component library 11 and inputs the components to a circuit diagram. The component library 11 is a library of components to be utilized in a circuit. The circuit database 13 is a database for storing the circuit data for a circuit diagram that is created by the designer. The created (or in process of creation) circuit diagram is outputted to and displayed on the input/output device 20. The processing by the circuit-design processing unit 12 is the same as that according to a conventional technique.

The DRC execution unit 14 performs the DRC on a designed circuit diagram. In the present embodiment, the DRC is performed by utilizing DRC data stored in the DRC database 16, instead of circuit data stored in the circuit database 13. In addition, in the case of a drawing check, the DRC may be performed by utilizing circuit data stored in the circuit database 13, as is the case with a conventional technique.

The DRC-data creation unit 15 creates DRC data dedicated to the DRC, based on circuit data stored in the circuit database 13. The created DRC data is stored in the DRC database 16.

The logic type automatic setting unit 17 discriminates the logic types of components in the circuit diagram, based on information, such as the types, the connection configurations, and the arrangement positions of the components, obtained from circuit data stored in the circuit database 13, and sets the obtained logic types for the corresponding components in the circuit data stored in the circuit database 13.

Figure 2:
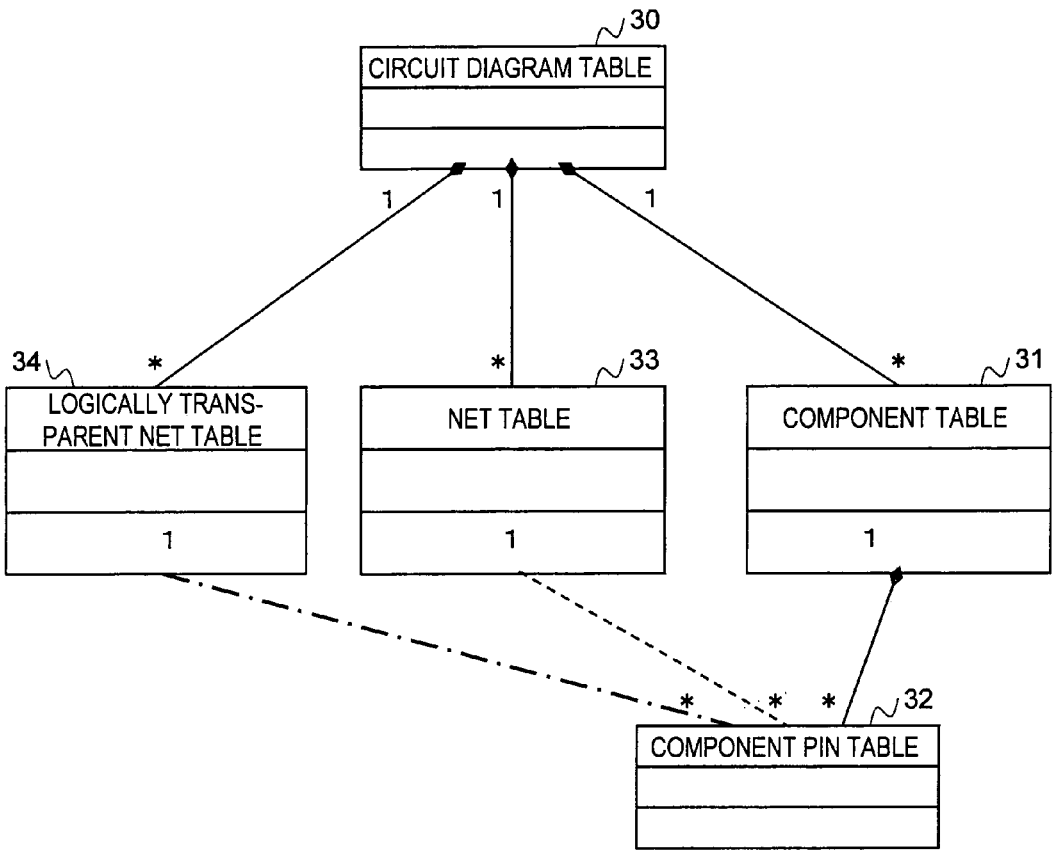
FIG. 2 is a diagram illustrating a configuration example of DRC data according to the present embodiment.
Figure 21:
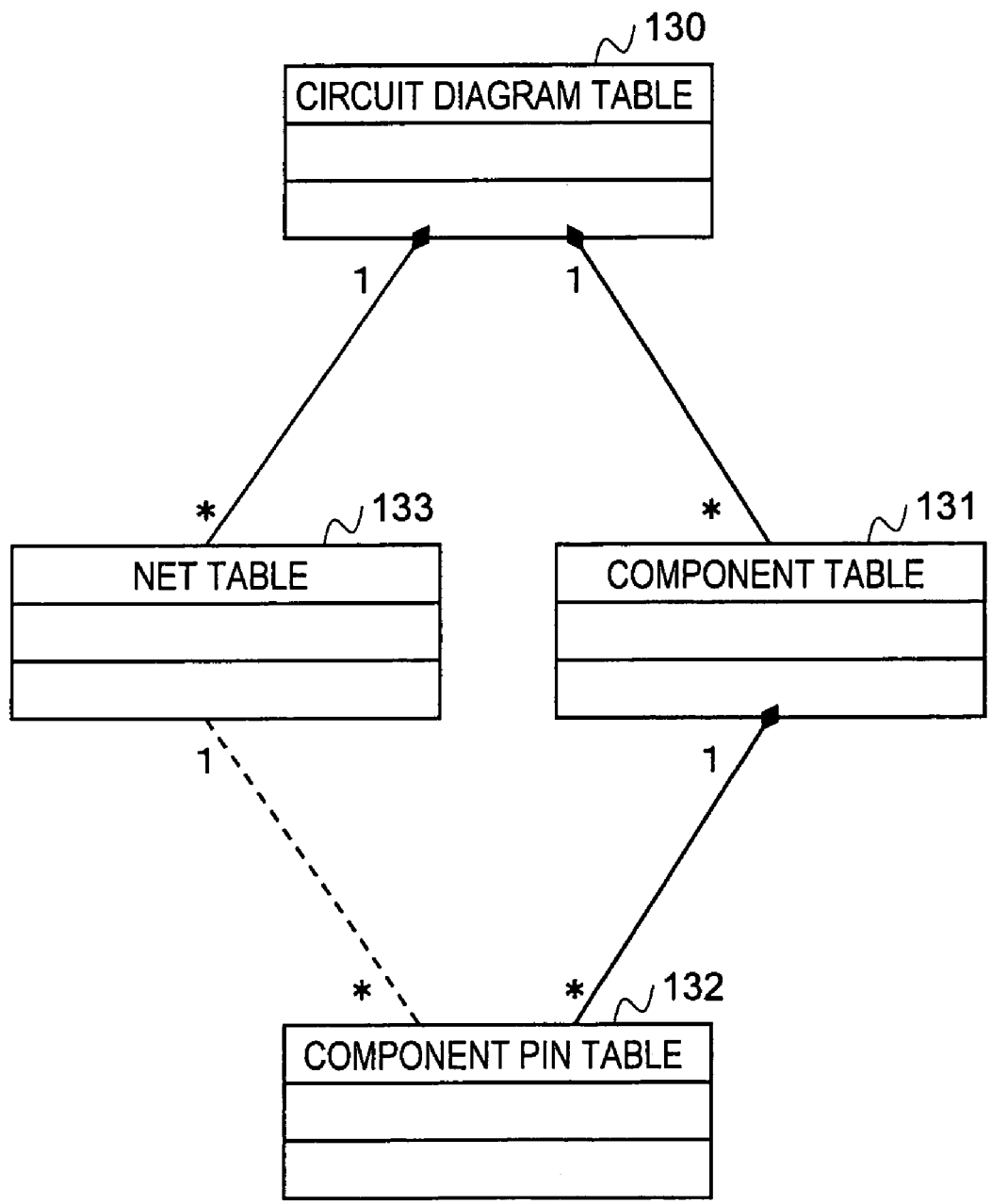
FIG. 21 is a diagram illustrating a configuration example of circuit data.

FIG. 2 is a diagram illustrating a configuration example of DRC data according to the present embodiment. The DRC data stored in the DRC database 16 consists of five tables, i.e., a circuit diagram table 30, a component table 31, a component pin table 32, a net table 33, and a logically transparent net table 34. The DRC data is configured in such away that the logically transparent net table 34 is added to the configuration of the circuit data illustrated in FIG. 21. The mark "*" in FIG. 2 stands for one or more pieces.

The circuit diagram table 30 is linked with a plurality of the component tables 31, a plurality of the net tables 33, and a plurality of logically transparent net tables 34. The component table 31 is linked with a plurality of the component pin tables 32 that belong thereto. The component pin table 32 is linked with a plurality of the parent component tables 31, a plurality of the connected net tables 33, and a plurality of the connected logically transparent net tables 34. The net table 33 is linked with the connected component pin tables 32. The logically transparent net table 34 is linked with the connected component pin tables 32.

Figure 3:
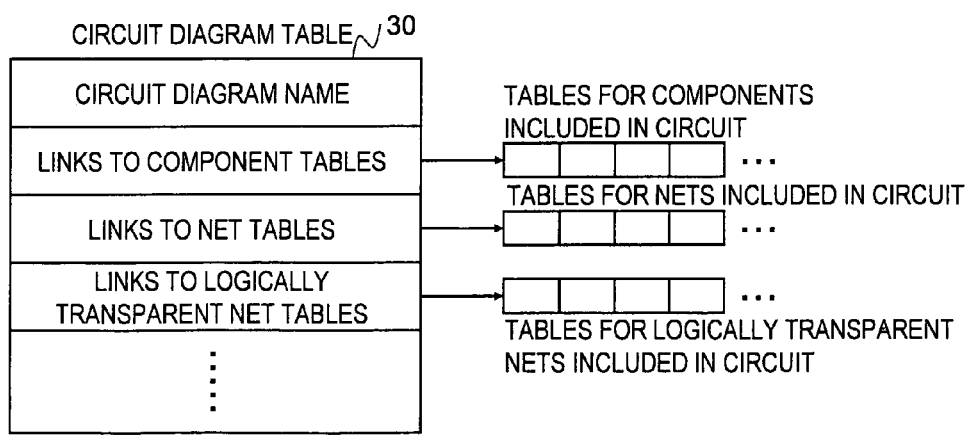
FIG. 3 is a chart representing an example of the data structure of a circuit diagram table according to the present embodiment.

FIG. 3 is a chart representing an example of the data structure of a circuit diagram table according to the present embodiment. The circuit diagram table 30 includes information on components incorporated in a printed circuit board and information on nets. The circuit diagram table 30 has information on a circuit diagram name, links to component tables, links to net tables, links to logically transparent net tables, and the like.

Figure 4:
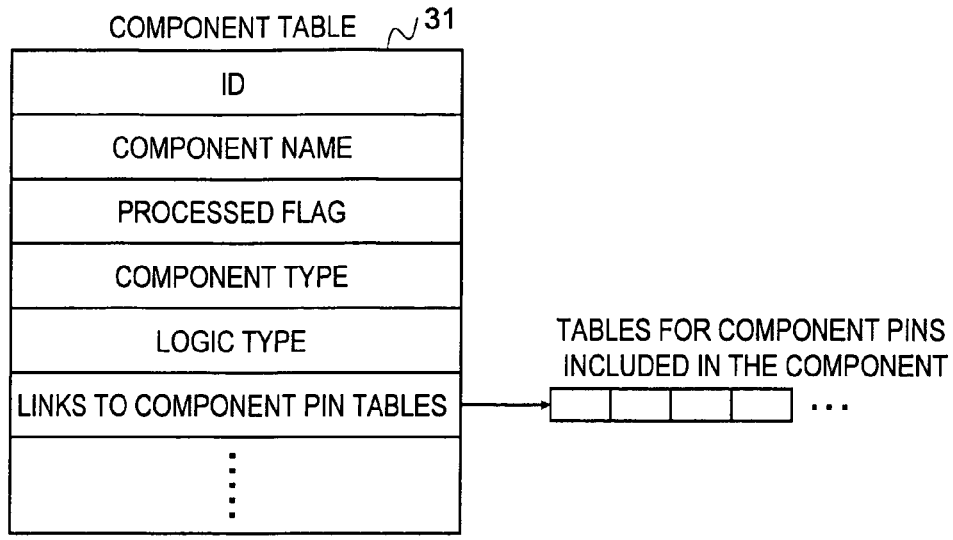
FIG. 4 is a chart representing an example of the data structure of a component table according to the present embodiment.

FIG. 4 is a chart representing an example of the data structure of a component table according to the present embodiment. The component table 31 represents components incorporated in a printed circuit board. The component table 31 has information on an ID, a component name, a processed flag, component types, logic types, links to component pin tables, and the like. The component type includes a value representing a component itself such as a resistor or a capacitor. The logic type includes a value representing the properties of a component, such as a pull-down resistor or a pull-up resistor, that is obtained by further sorting the component types. The processed flag is a flag for determining whether or not arbitrary processing has been performed.

Figure 5:
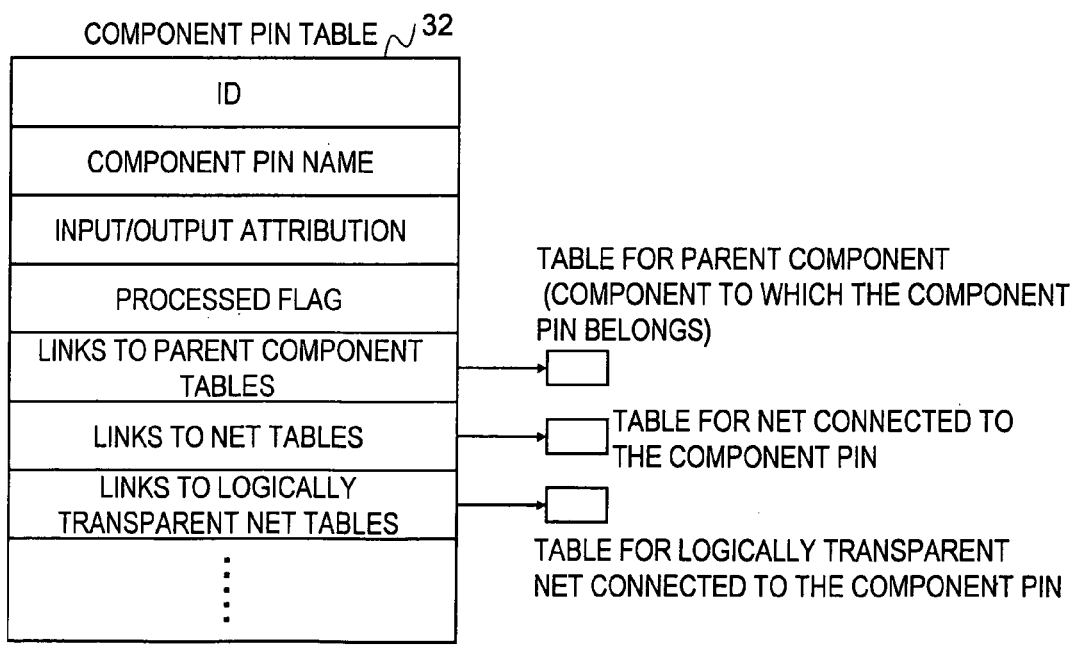
FIG. 5 is a chart representing an example of the data structure of a component pin table according to the present embodiment.

FIG. 5 is a chart representing an example of the data structure of a component pin table according to the present embodiment. The component pin table 32 representing pins, which are connected to lines of nets, of each component. The component pin table 32 has information on an ID, a component pin name, an input/output attribution, processed flags, links to parent component tables, links to net tables, links to logically transparent net tables, and the like. The input/output attribution includes an attribution such as an input (IN), an output (OUT), or bidirectional (INOUT).

Figure 6:
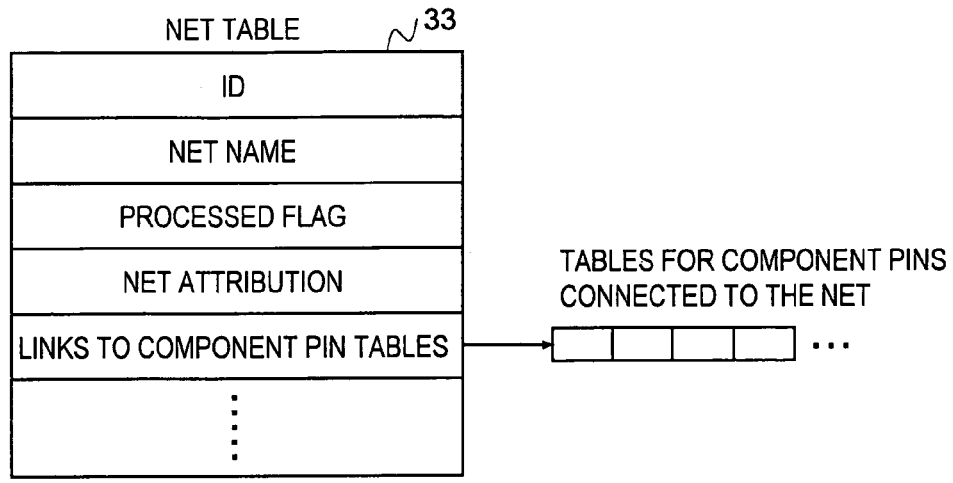
FIG. 6 is a chart representing an example of the data structure of a net table according to the present embodiment.

FIG. 6 is a chart representing an example of the data structure of a net table according to the present embodiment. The net table 33 represents a line of a net that connects a component with another. The net table 33 has information on an ID, a net name, a processed flag, a net attribution, links to component pin tables, and the like. The net attribution includes a value representing a net attribution such as a general net, a power source net which is connected to a power source, and an earth net which is connected to the ground.

Figure 7:
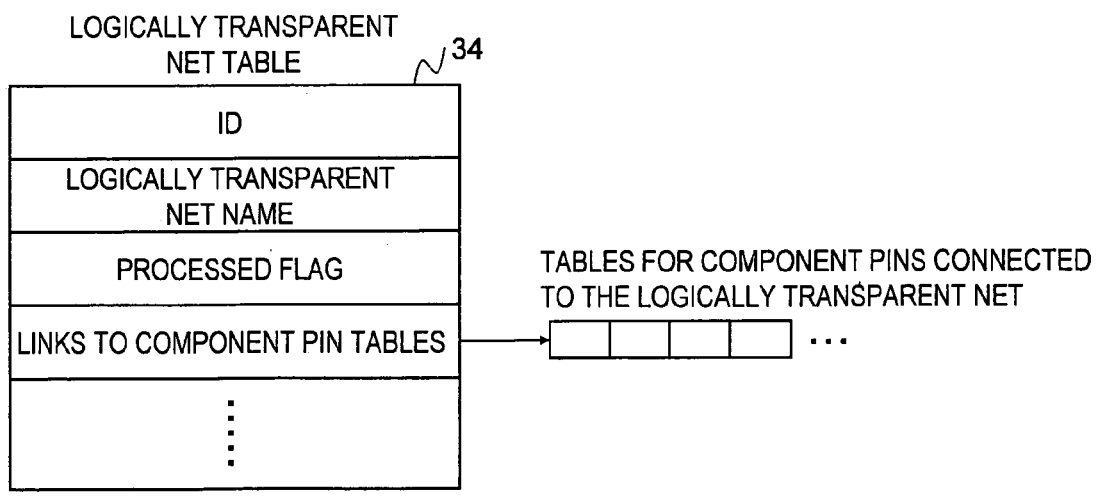
FIG. 7 is a chart representing an example of the data structure of a logically transparent net table according to the present embodiment.

FIG. 7 is a chart representing an example of the data structure of a logically transparent net table according to the present embodiment. The logically transparent net table 34 representing a net that passes through a logically transparent component and connects components through which the net cannot passes logically. Each net passes through a component through which the net can logically pass; therefore, the logically transparent net table 34 holds as links only the component pins of components through which nets cannot logically pass. The logically transparent net table 34 has information on an ID, a logically transparent net name, a processed flag, links to component pin tables, and the like.

Figure 8:
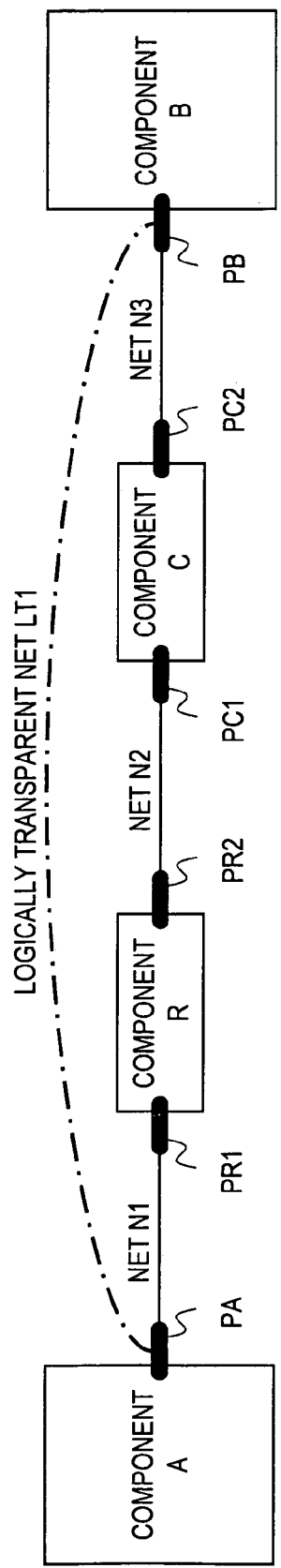
FIG. 8 is a diagram for explaining the concept of a logically transparent net.

FIG. 8 is a diagram for explaining the concept of a logically transparent net. FIG. 8 is an example in which a logically transparent net LT1 is set in the circuit diagram (sample) illustrated in FIG. 22. The concept of a logically transparent net is introduced in which logically permeable components are preliminarily passed through and component pins necessary for a logic check are connected with each other. In FIG. 8, a component R and a component C are logically transparent components. Accordingly, the logically transparent net LT1 eventually connects the component pin PA of the component A that is not logically permeable with the component pin PB of the component B that is not logically permeable. In addition, for convenience of explanation, FIG. 8 illustrates a logically transparent net; however, a logically transparent net is information to be set in DRC data, but not information to be set in a created circuit diagram.

Figure 9:
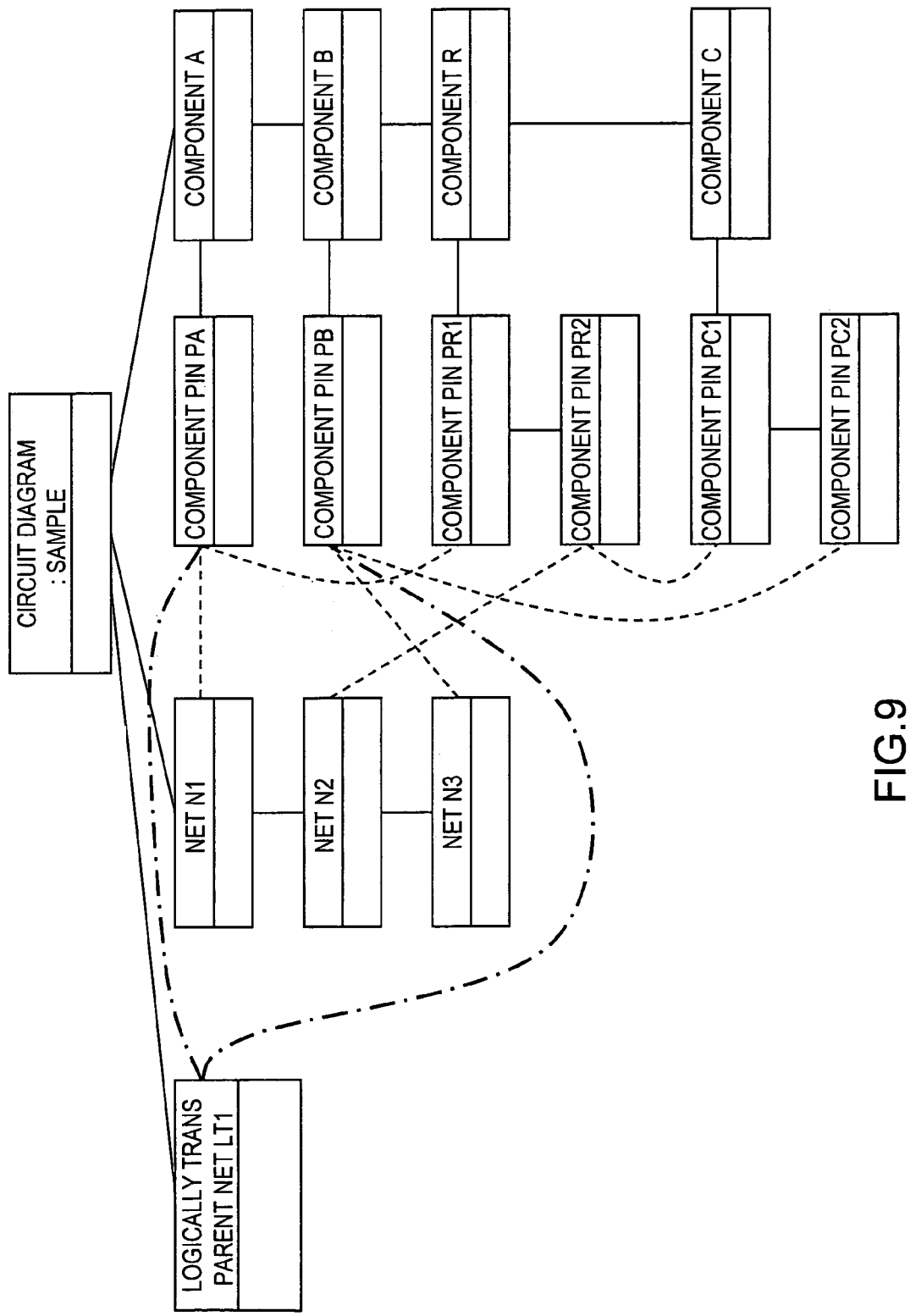
FIG. 9 is a diagram illustrating an example of the structure of a DRC database for a circuit diagram.

FIG. 9 is a diagram illustrating an example of the structure of a DRC database for a circuit diagram. FIG. 9 is a database structure, of the DRC database 16, that represents the circuit diagram (sample) illustrated in FIG. 8. Hereinafter, a procedure for accessing a database will be explained in the case where, in the logical connection in the circuit diagram illustrated in FIG. 8, the link from the component pin PA to the component pin PB is obtained.

Procedure 1: the link from the component pin PA of the component A to the logically transparent net LT1 is obtained; and Procedure 2: the link from the logically transparent net LT1 to the component pin PB is obtained.

Figure 22:
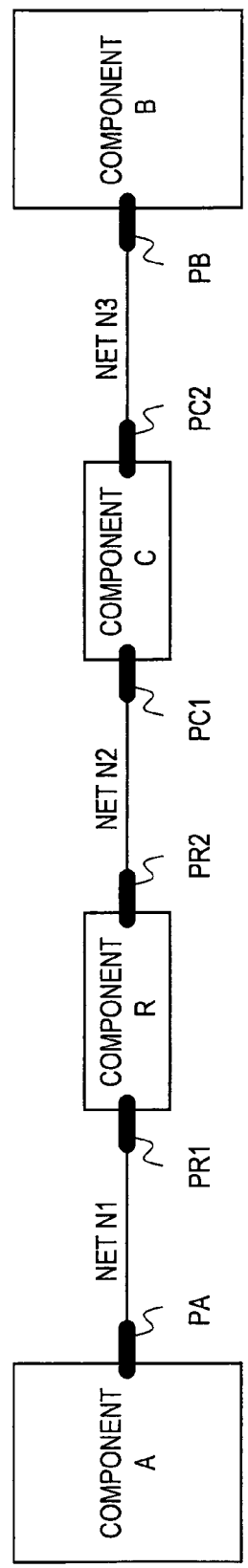
FIG. 22 is a diagram illustrating an example of a circuit diagram.
Figure 23:
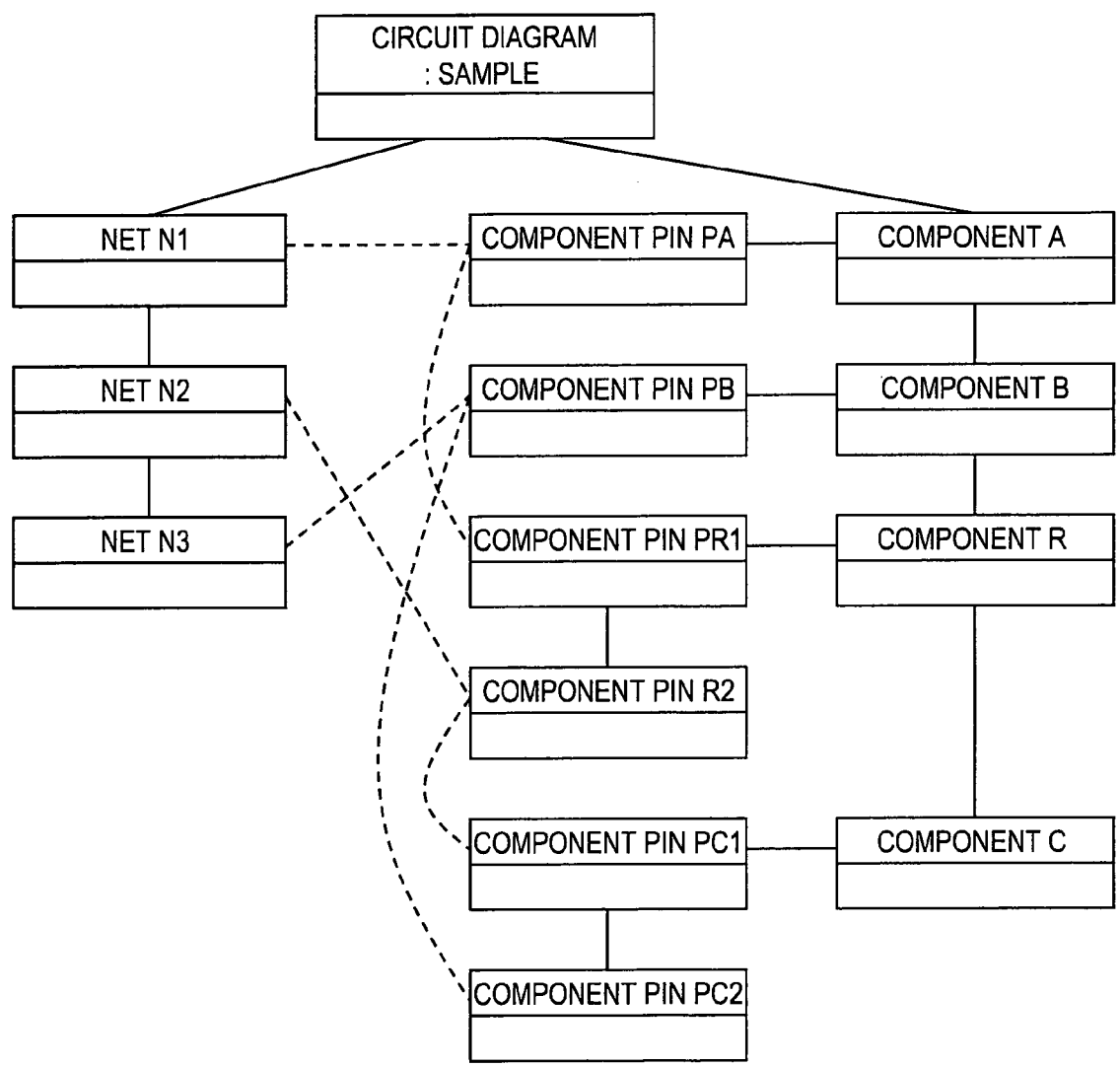
FIG. 23 is a diagram illustrating an example of the structure of a database for a circuit diagram.

As described above, by utilizing the concept of the logically transparent net, the procedure explained with reference to FIGS. 22 and 23 can significantly be reduced. The processing speed of a logical check of the DRC utilizing logically transparent nets is raised in proportion not only to the number of logically transparent components such as resistors and capacitors but also to the number of DRC check items.

Figure 10:
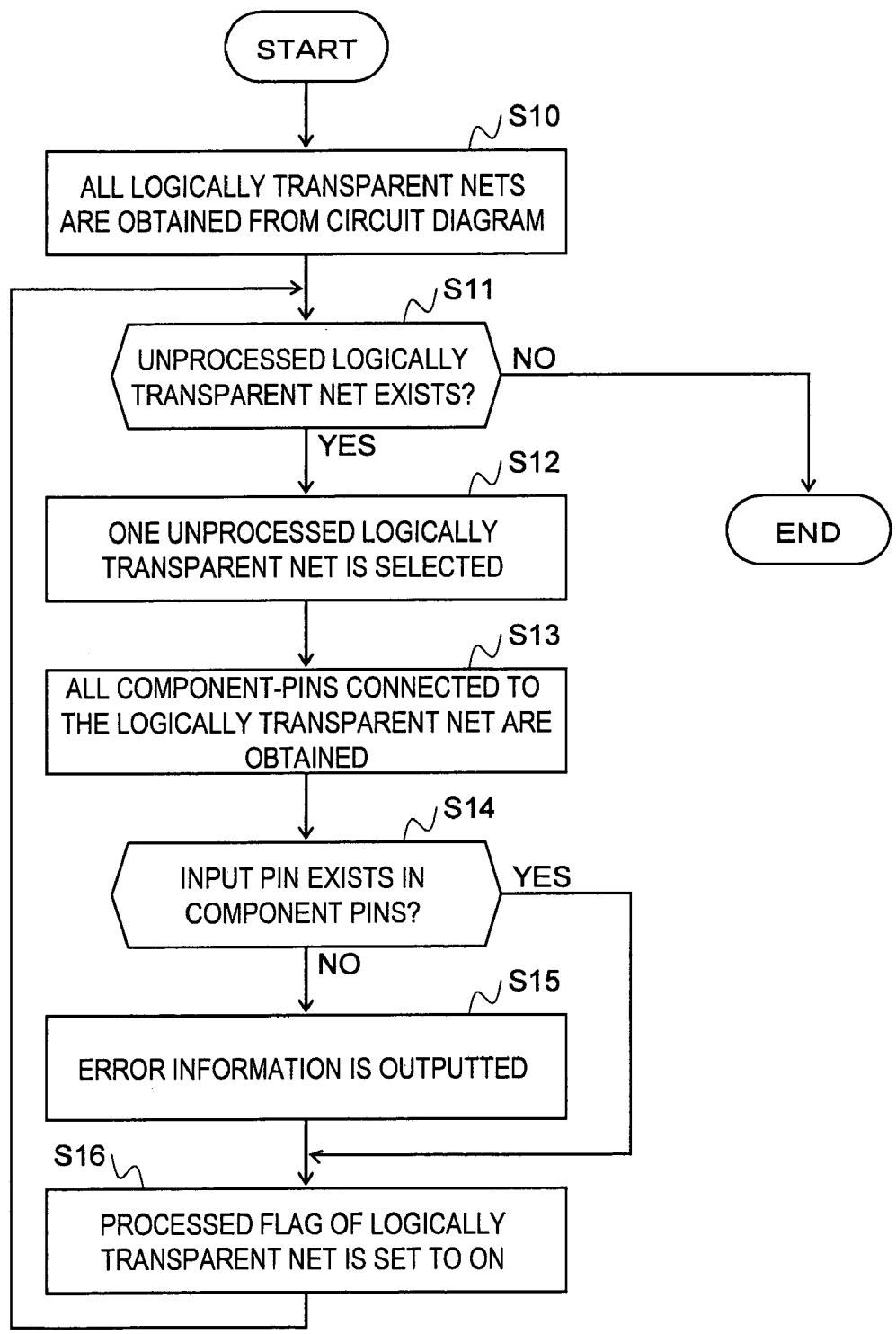
FIG. 10 is a flowchart of logic check processing, carried out by a DRC execution unit, according to the present embodiment.
Figure 24:
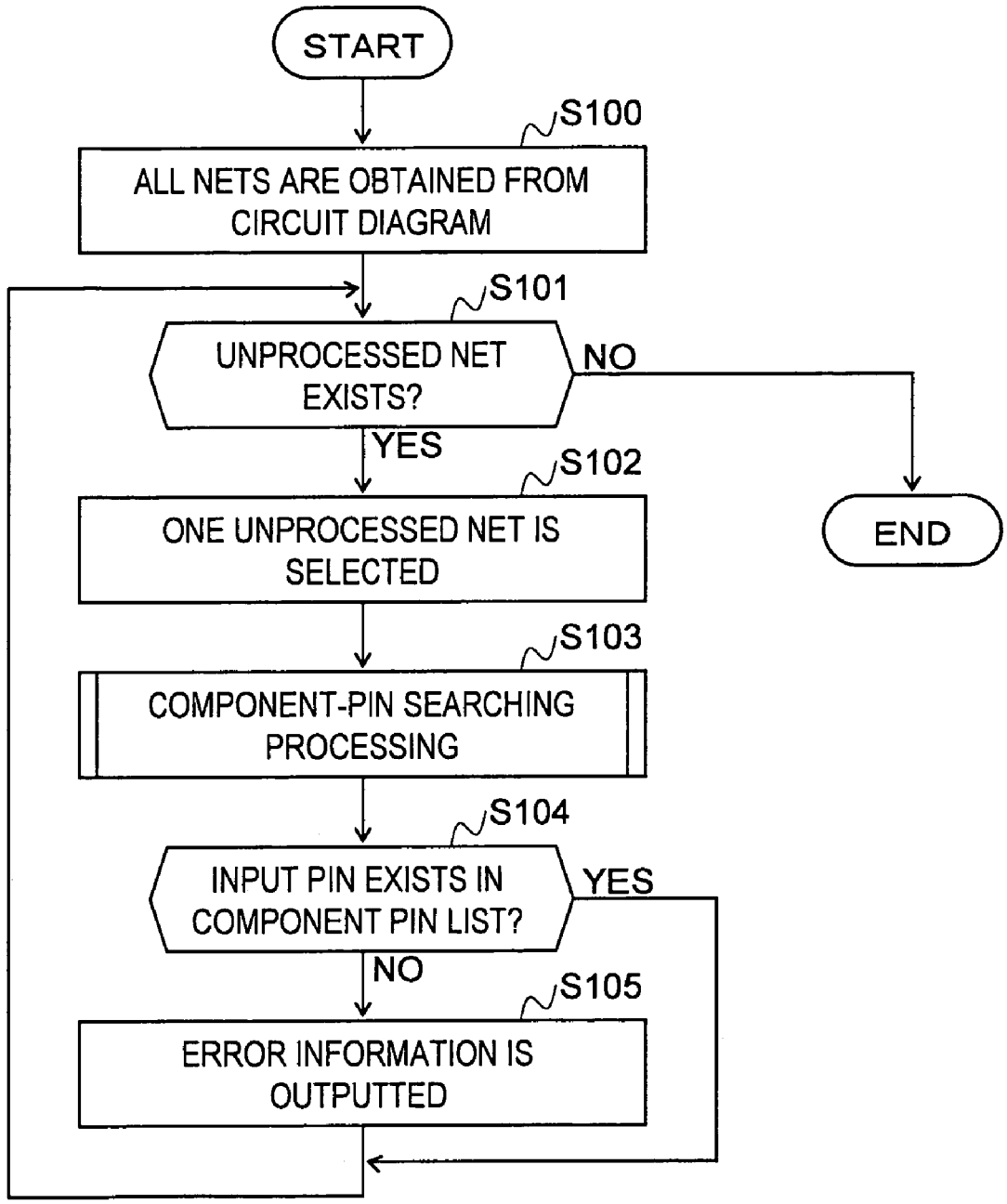
FIG. 24 is a flowchart of logic check processing carried out by a DRC execution unit.
Figure 25:
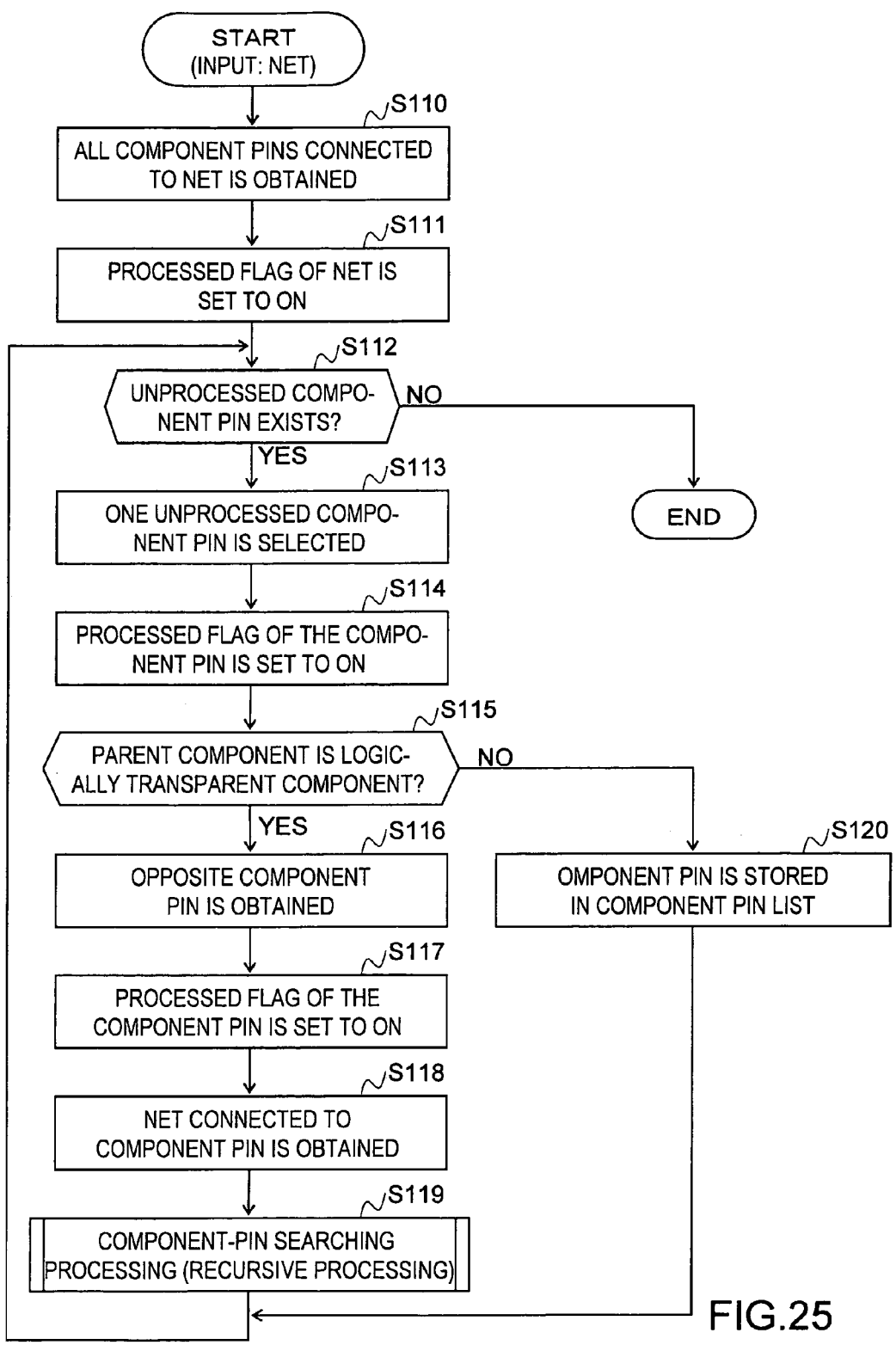
FIG. 25 is a flowchart of component-pin searching processing.

FIG. 10 is a flowchart of logic check processing, carried out by the DRC execution unit, according to the present embodiment. The logic check processing carried out by the DRC execution unit 14 differs depending on the contents to be checked. Here, as is the case with FIG. 24, processing will be explained, as an example, in which whether or not any input pin exists in component pins connected to one net is checked. It is assumed that, before the start of the processing, respective processed flags for the tables are set to the initial setting values "OFF".

In the first place, all logically transparent nets are obtained from the circuit diagram (Step S10). In other words, all the logically transparent net tables 34 that are linked with the circuit diagram table 30 are obtained. Hereinafter, it is assumed that, similarly, processing is carried out by utilizing information on the tables.

When no unprocessed (processed flag=OFF) logically transparent net exists in the logically transparent nets obtained in Step S10 (Step S11), the processing is ended.

When any unprocessed (processed flag=OFF) logically transparent net exists in the logically transparent nets obtained in Step S10 (Step S11), one unprocessed logically transparent net is selected (Step S12) and all the component-pins of the logically transparent net are obtained (Step S13).

When, after the input/output attributions of the all component pins obtained in Step S13 are ascertained, no input pin exists (Step S14), the error information on the logically transparent net selected in Step S12 is outputted (Step S15). The processed flag of the logically transparent net obtained in Step S12 is set to ON (Step S16), and then the processing in Step S11 is resumed. The error information outputted in Step S15 is, for example, an error message such as "the logically transparent net name is not connected to any input pin".

In the present embodiment, an example of a check on the existence of an input pin has been explained; however, a check on whether or not any unconnected power supply pin remains, a check on whether or not no output pin exists in a net, a check on dot logic, and the like can also be carried out at high speed, by utilizing the logically transparent net.

Next, the creation processing, of a logically transparent net, by the DRC-data creation unit 15 will be explained. Here, in the first place, an example of a specific processing procedure will be explained with reference to an example of a circuit diagram in FIG. 8. It is assumed that, before the start of the following processing, respective processed flags for the tables are set to the initial setting values "OFF".

Procedure 1: the components (the component A, the component B, the component R, and the component C) are obtained from the sample circuit diagram;

Procedure 2: at this time point, the component A, the component B, the component R, and the component C are all unprocessed (processed flag=OFF) components; it is found that, from the respective logic types of the obtained components, the component R and the component C are logically transparent components; here, it is assumed that the component A, out of the component A and the component B that are not logically transparent components, is selected and the processing is started with the component A;

Procedure 3: the component pin PA of the component A is obtained; because the component A is not a logically transparent component, the component pin PA is stored in a logically-transparent-net component pin list; the processed flag of the component PA is set to ON; here, the logically-transparent-net component pin list is a list for the component pins connected to a logically transparent net to be created;

Procedure 4: the net N1 connected to the component pin PA is obtained;

Procedure 5: the link from the net N1 to the component pin PR1 is obtained (because the component pin PA has been processed); the processed flag of the component pin PR1 is set to ON;

Procedure 6: because the component R that is the parent component of the component pin PR1 is a logically transparent component, the component pin PR1 is not added to the logically-transparent-net component pin list; the link from the component R to the component pin PR2 is obtained (because the component pin PR1 has been processed); the processed flag of the component pin PR2 is set to ON;

Procedure 7: the link from the component pin PR2 to the net N2 is obtained;

Procedure 8: because, as is the case with the component R, the component C is a logically transparent component, the following processing that is the same as that from the procedure 5 to the procedure 7 is carried out so as to obtain the net N3.

Procedure 9: the link from the net N3 to the component pin PB is obtained; because the component B that is the parent component of the component pin PB is not a logically transparent component, the component pin PB is stored in a logically-transparent-net component pin list; and Procedure 10: finally, the component pins PA and PB of the components A and B, respectively, that are not logically transparent components are stored in the logically-transparent-net component pin list; the logically transparent net LT1 is created and the links to component pins PA and PB are set.

As discussed above, by, through the DRC-data creation unit 15, preliminarily creating a logically transparent net for the whole circuit, the logic check processing by the DRC execution unit 14 can be carried out at high speed.

Figure 11:
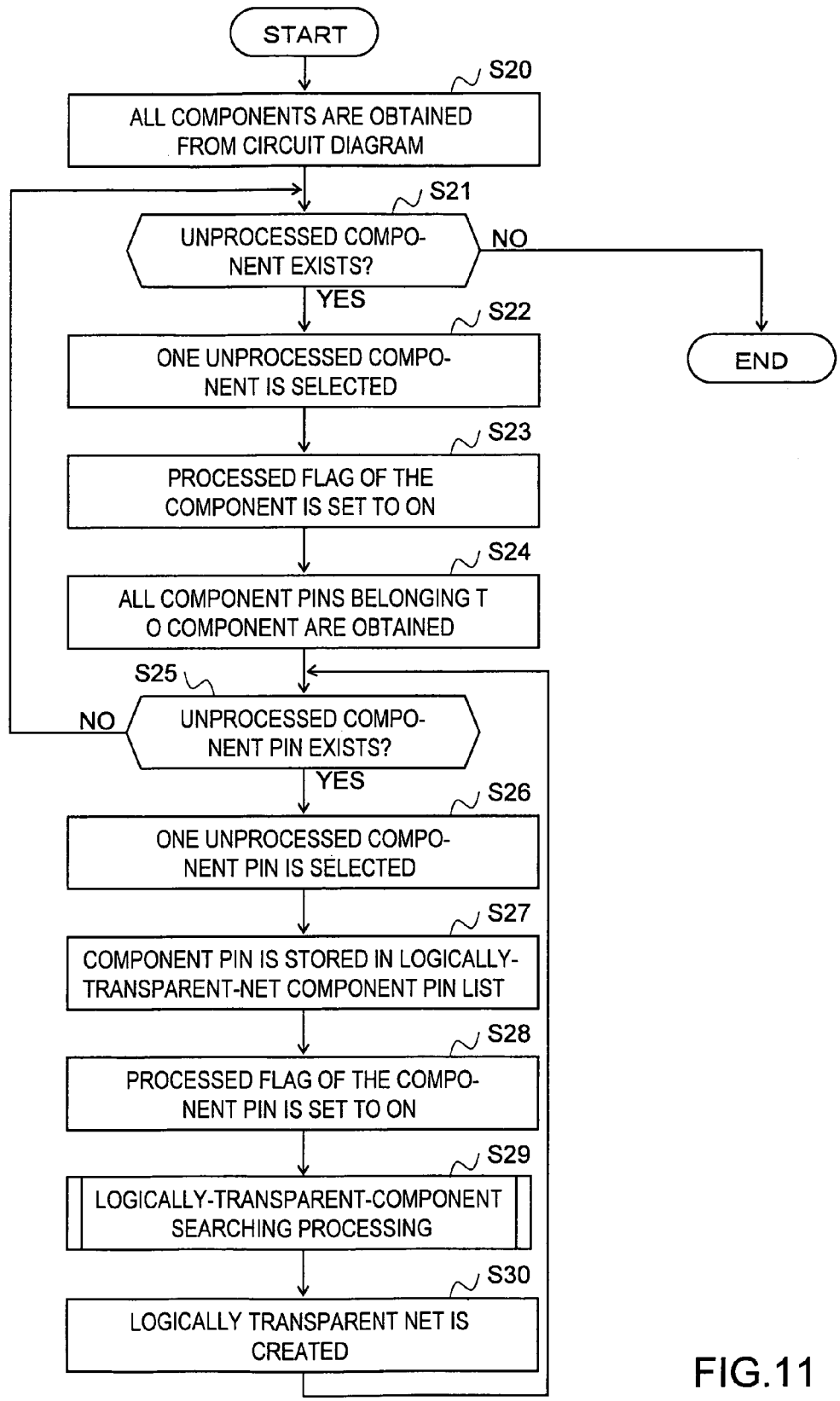
FIG. 11 is a flowchart of logically-transparent-net creation processing, carried out by the DRC execution unit, according to the present embodiment.

FIG. 11 is a flowchart of logically-transparent-net creation processing, carried out by the DRC execution unit, according to the present embodiment. It is assumed that, before the start of the processing, respective processed flags for the tables are set to the initial setting values "OFF".

In the first place, all components are obtained from the circuit diagram (Step S20). In other words, all the component tables 31 that are linked with the circuit diagram table 30 are obtained. Hereinafter, it is assumed that, similarly, processing is carried out by utilizing information on the tables.

When no unprocessed (processed flag=OFF) component exists in the components obtained in Step S20 (Step S21), the processing is ended.

When any unprocessed (processed flag=OFF) component exists in the components obtained in Step S20 (Step S21), one unprocessed component is selected (Step S22), the processed flag of the component is set to ON (Step S23) and all the component pins belonging to the component are obtained (Step S24). In addition, when an unprocessed component is selected, logic types are ascertained so as to select a component that is not a logically transparent component.

When no unprocessed (processed flag=OFF) component pin exists in the component pins obtained in Step S24 (Step S25), the processing in Step S21 is resumed.

When any unprocessed (processed flag=OFF) component pin exists in the component pins obtained in Step S24 (Step S25), one unprocessed component pin is selected (Step S26), the component pin is stored in a logically-transparent-net component pin list (Step S 27) and the processed flag of the component pin is set to ON (Step S28). Logically-transparent-component searching processing, described later, is carried out (Step S29). Based on the logically-transparent-net component pin list, a logically transparent net is created (Step S30). In other words, the logically transparent net table 34 is created that has a link with the table for the component pin stored in the logically-transparent-net component pin list. In addition, each time the logically transparent net table 34 is created, the logically-transparent-net component pin list is cleared. The processing in Step S25 is resumed.

Figure 12:
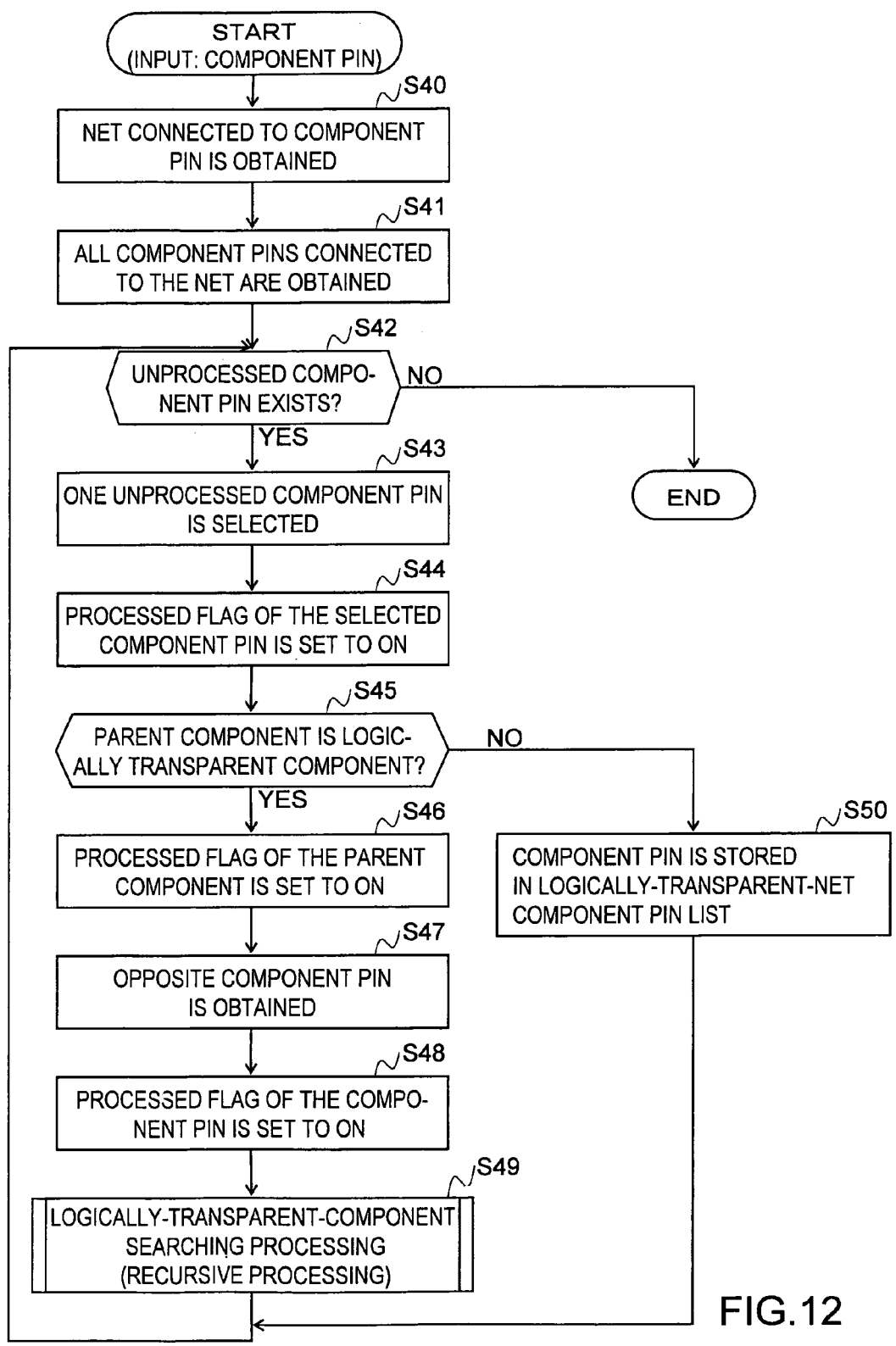
FIG. 12 is a flowchart of logically-transparent-component searching processing.

FIG. 12 is a flowchart illustrating the logically-transparent-component searching processing. With a component pin considered as an input, the logically-transparent-component searching processing is carries out.

In the first place, all nets connected to the obtained (or selected) component pin are obtained (Step S40). All the component pins connected to the obtained net are obtained (Step S41).

When no unprocessed (processed flag=OFF) component pin exists in the component pins obtained in Step S41 (Step S42), the processing is ended.

When any unprocessed (processed flag=OFF) component pin exists in the component pins obtained in Step S41 (Step S42), one unprocessed component pin among component pins that are obtained in Step S41 is selected (Step S43), the processed flag of the selected component pin is set to ON (Step S 44).

When the parent component of the component pin selected in Step S43 is a logically transparent component (Step S45), the processed flag of the parent component of the component pin selected in Step S43 is set to ON (Step S46). The component pin, of the parent component, opposite to the component pin selected in Step S43 is obtained (Step S47), and the processed flag of the component pin obtained in Step S47 is set to ON (Step S48). The logically-transparent-component searching processing is recursively carried out (Step S49). The processing in Step S42 is resumed. In addition, whether or not a component is a logically transparent component is determined based on the component logical type and the like.

When the parent component of the component pin selected in Step S43 is not a logically transparent component (Step S45), the component pin selected in Step S43 is stored in the logically-transparent-net component pin list (Step S50) and the processing in Step S42 is resumed.

Next, automatic setting of the logic types of components will be explained. In the case where a logically transparent net is created by the DRC-data creation unit 15, it is required that the respective logic types of components have been set so that whether or not each component is a logically transparent component is determined. In the present embodiment, the logic type automatic setting unit 17 automatically discriminates the logic types of components in the circuit diagram, based on information, such as the types, the connection configurations, and the arrangement positions of the components, obtained from circuit data stored in the circuit database 13, and sets the obtained logic types of the components in the component tables for the circuit data stored in the circuit database 13. In addition, all the respective logic types of components may automatically be set or it may also possible that part of the logic types are automatically set and the rest is manually set by a designer.

The logically transparent components are various components including a dumping resistor and a coupling capacitor described above. Here, as examples, five logically transparent resistors will be explained with reference to the drawings.

Figure 13:
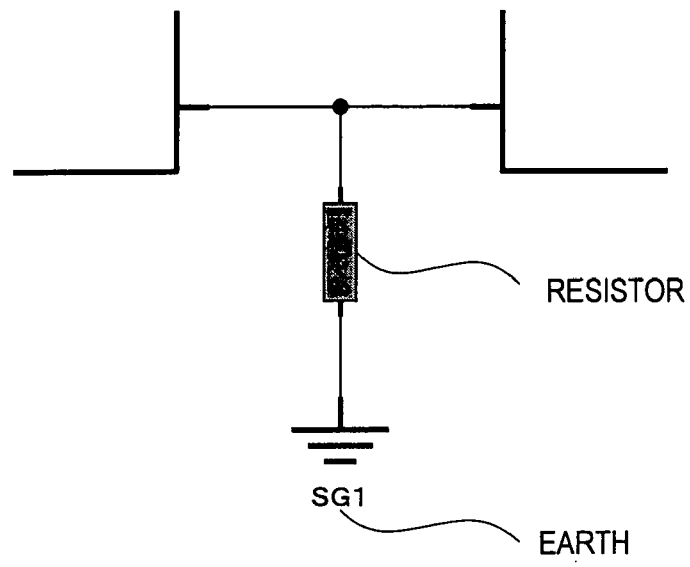
FIG. 13 is a diagram for explaining a pull-down resistor.

FIG. 13 is a diagram for explaining a pull-down resistor. A resistor that has two terminals the one of which is connected to a general net and the other of which is connected to the earth net is referred to as a pull-down resistor.

Figure 14:
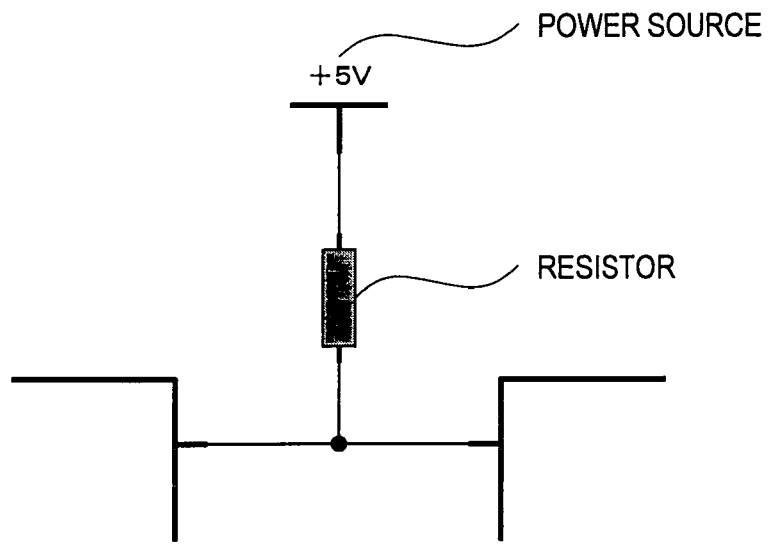
FIG. 14 is a diagram for explaining a pull-up resistor.

FIG. 14 is a diagram for explaining a pull-up resistor. A resistor that has two terminals the one of which is connected to a general net and the other of which is connected to the power-source net is referred to as a pull-up resistor.

Figure 15:
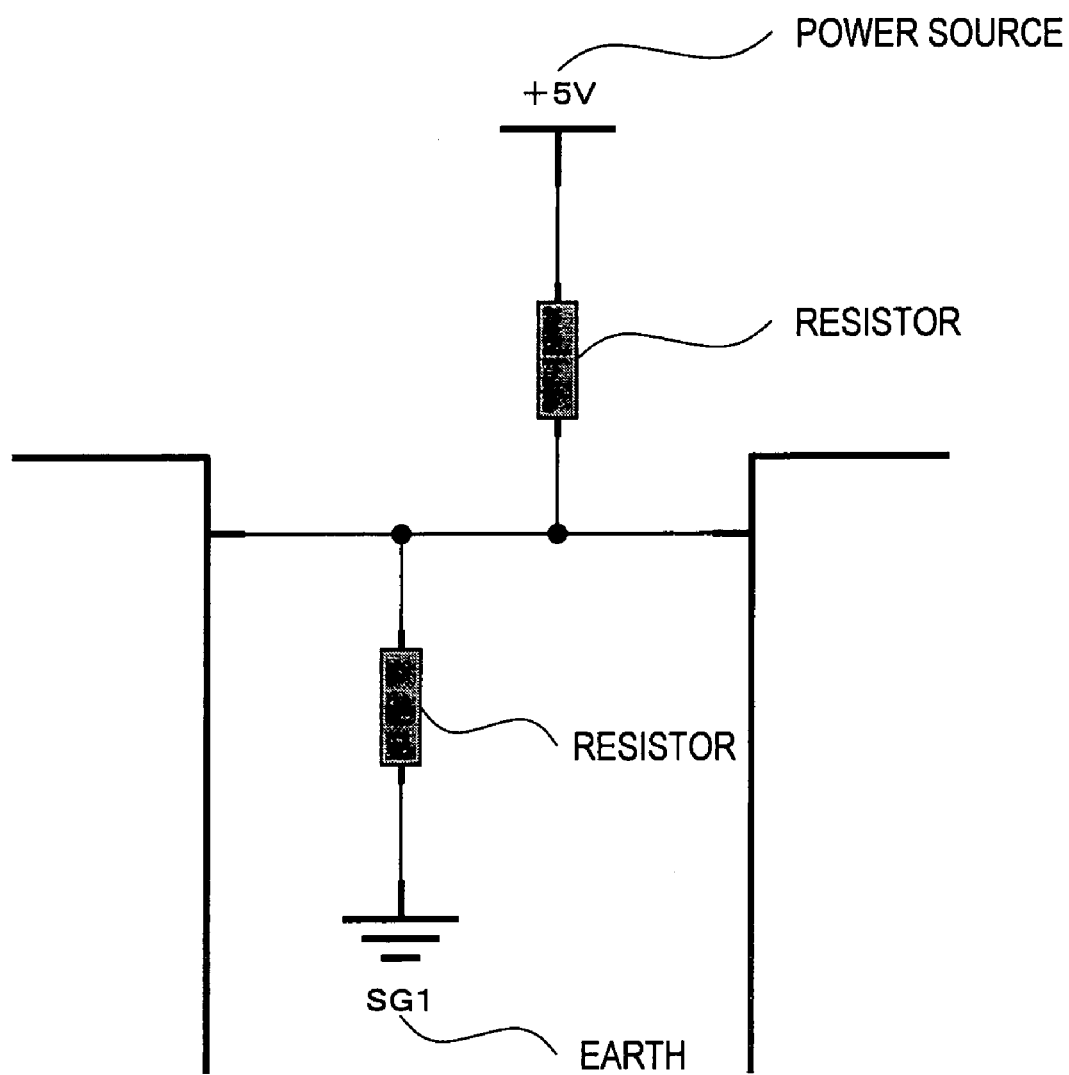
FIG. 15 is a diagram for explaining a thevenin resistor.

FIG. 15 is a diagram for explaining a thevenin resistor. In the case where the pull-down resistor illustrated in FIG. 13 and the pull-up resistor illustrated in FIG. 14 exist in the same net, the combination of both resistors is referred to as a thevenin resistor.

Figure 16:
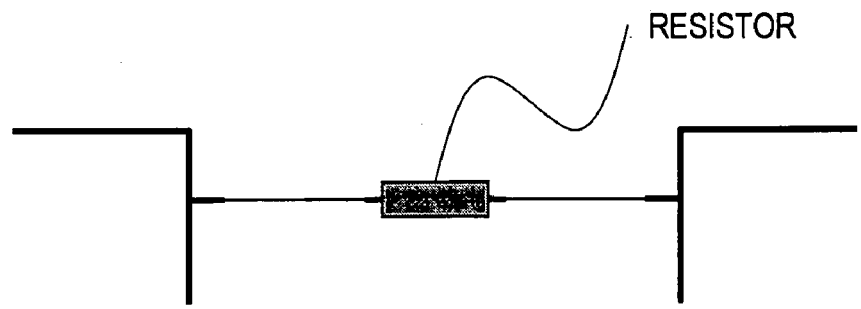
FIG. 16 is a diagram for explaining a dumping resistor.

FIG. 16 is a diagram for explaining a dumping resistor. A resistor that has two terminals that are each connected to a general net is referred to as a dumping resistor.

Figure 17:
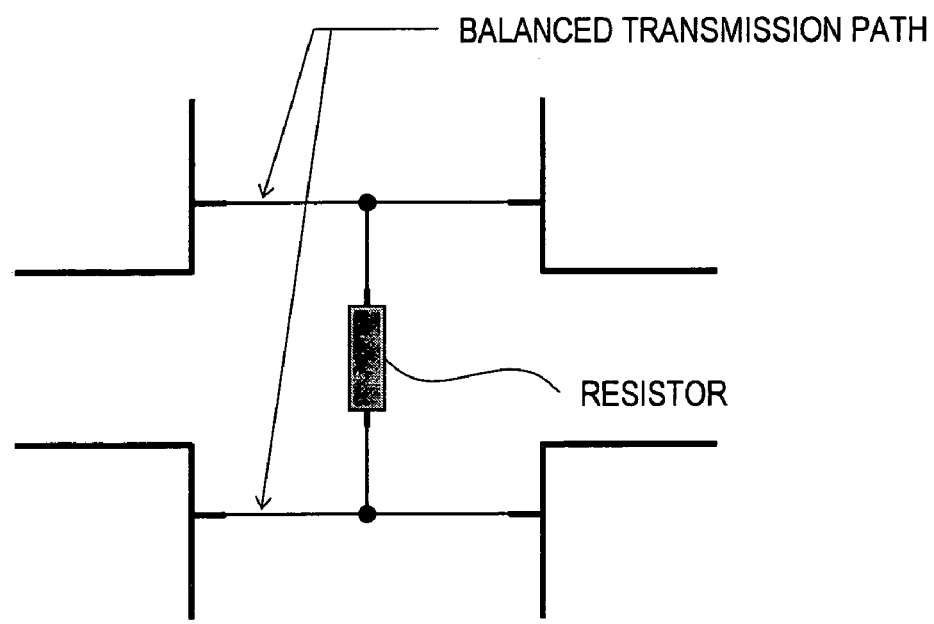
FIG. 17 is a diagram for explaining a differential termination resistor.

FIG. 17 is a diagram for explaining a differential termination resistor. A resistor that has two terminals that are each connected to a net set as a balanced transmission path is referred to as a differential termination resistor.

As described above, the conditions for determining the respective logic types of components are clear; therefore, by analyzing information obtained from circuit data stored in the circuit database 13, the logic types of components can automatically be discriminated and set. For example, in the case where the component type, in the component table 31, of a component is a resistor, the component has links with two component pin tables 32, one of the component pin tables 32 has a link to a net table 33 whose net attribution is an earth net, and the other of the component pin tables 32 has a link to a net table 33 whose net attribution is a general net, it can readily be determined that the component is a pull-down resistor.

Figure 18:
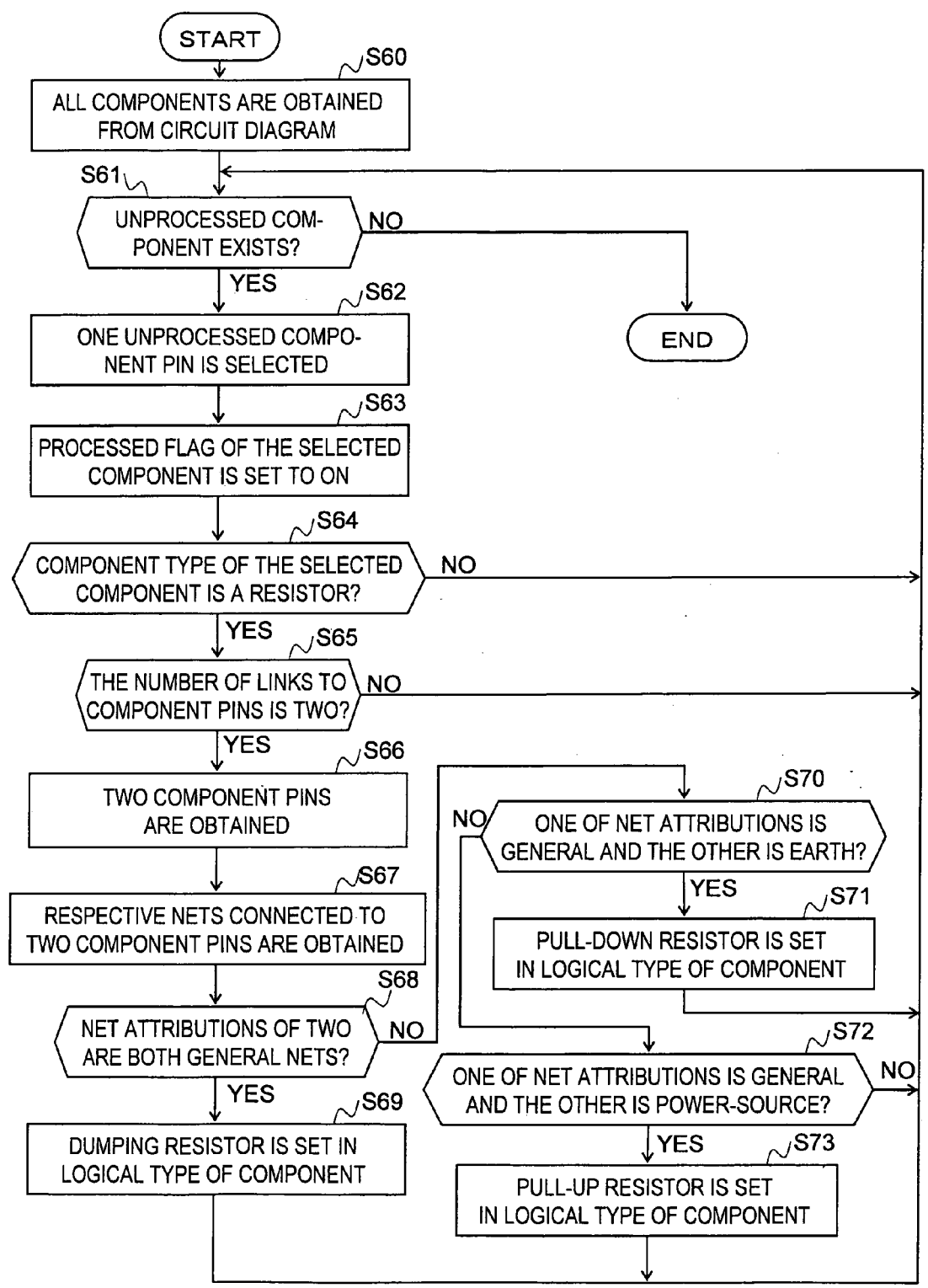
FIG. 18 is a flowchart of logic type automatic setting processing, carried out by a logic type automatic setting unit, according to the present embodiment.

FIG. 18 is a flowchart of logic type automatic setting processing, carried out by a logic type automatic setting unit, according to the present embodiment. In the present embodiment, an example will be described in which the logic types of a pull-down resistor, a pull-up resistor, and a dumping resistor, which are readily discriminated, are automatically set. Similarly, the discrimination processing logic corresponding to each logic type enables the logic-type automatic setting of components of other logic types. It is assumed that, before the start of the processing, respective processed flags for the tables are set to the initial setting values "OFF".

In the first place, all components are obtained from the circuit diagram (Step S60). In other words, all the component tables 31 that are linked with the circuit diagram table 30 are obtained. Hereinafter, it is assumed that, similarly, processing is carried out by utilizing information on the tables.

When no unprocessed (processed flag=OFF) component exists in the components obtained in Step S60 (Step S61), the processing is ended.

When any unprocessed (processed flag=OFF) component exists in the components obtained in Step S60 (Step S61), one unprocessed component is selected (Step S62) and the processed flag of the selected component is set to ON (Step S 63).

When the component type of the component selected in Step S62 is not a resistor (Step S64), or the number of the links, of the component selected in Step S62, to component pins is not two (Step S65), the processing in Step S61 is resumed.

When the component type of the component selected in Step S62 is a resistor (Step S64) and the number of the links, of the component selected in Step S62, to component pins is two (Step S65), the two component pins of the selected component are obtained (Step S66). Respective nets connected to the two component pins obtained in Step S66 are obtained (Step S67).

When the net attributions of the two nets obtained in Step S67 are both general nets (Step S68), a dumping resistor is set in the logical type of the component selected in Step S62 (Step S69) and the processing in Step S61 is resumed.

When one of the net attributions of the two nets obtained in Step S67 is a general net and the other is an earth net (Step S70), a pull-down resistor is set in the logical type of the component selected in Step S62 (Step S71) and the processing in Step S61 is resumed.

When one of the net attributions of the two nets obtained in Step S67 is a general net and the other is a power-source net (Step S72), a pull-up resistor is set in the logical type of the component selected in Step S62 (Step S73) and the processing in Step S61 is resumed.

When the logic type is none of a pull-down resistor, a pull-up resistor, and a dumping resistor, the processing in Step S61 is directly resumed.

As illustrated in FIG. 18, the respective logic types of components can automatically be set, by discriminating them, based on the information on tables in circuit data stored in the circuit database 13. Additionally, instead of automatically setting the logic types of all components, the logic types of part of all the components may manually be set.

The processing related to the design verification according to the present embodiment described above can be realized by means of a computer and a software program; it is possible not only to store the program in a computer readable storage medium, but also to provide the program through a network.

Figure 19:
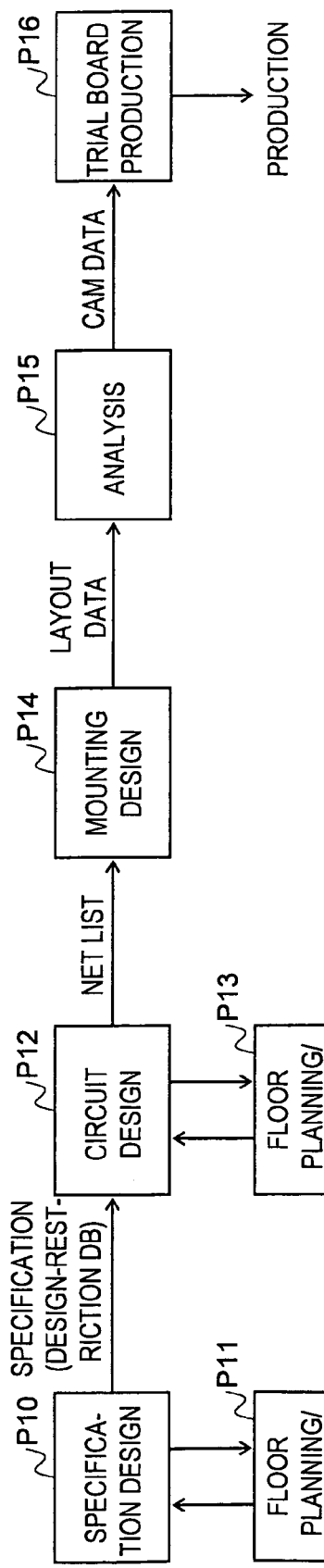
FIG. 19 is a chart illustrating the development flow for a printed circuit board.
Figure 20:
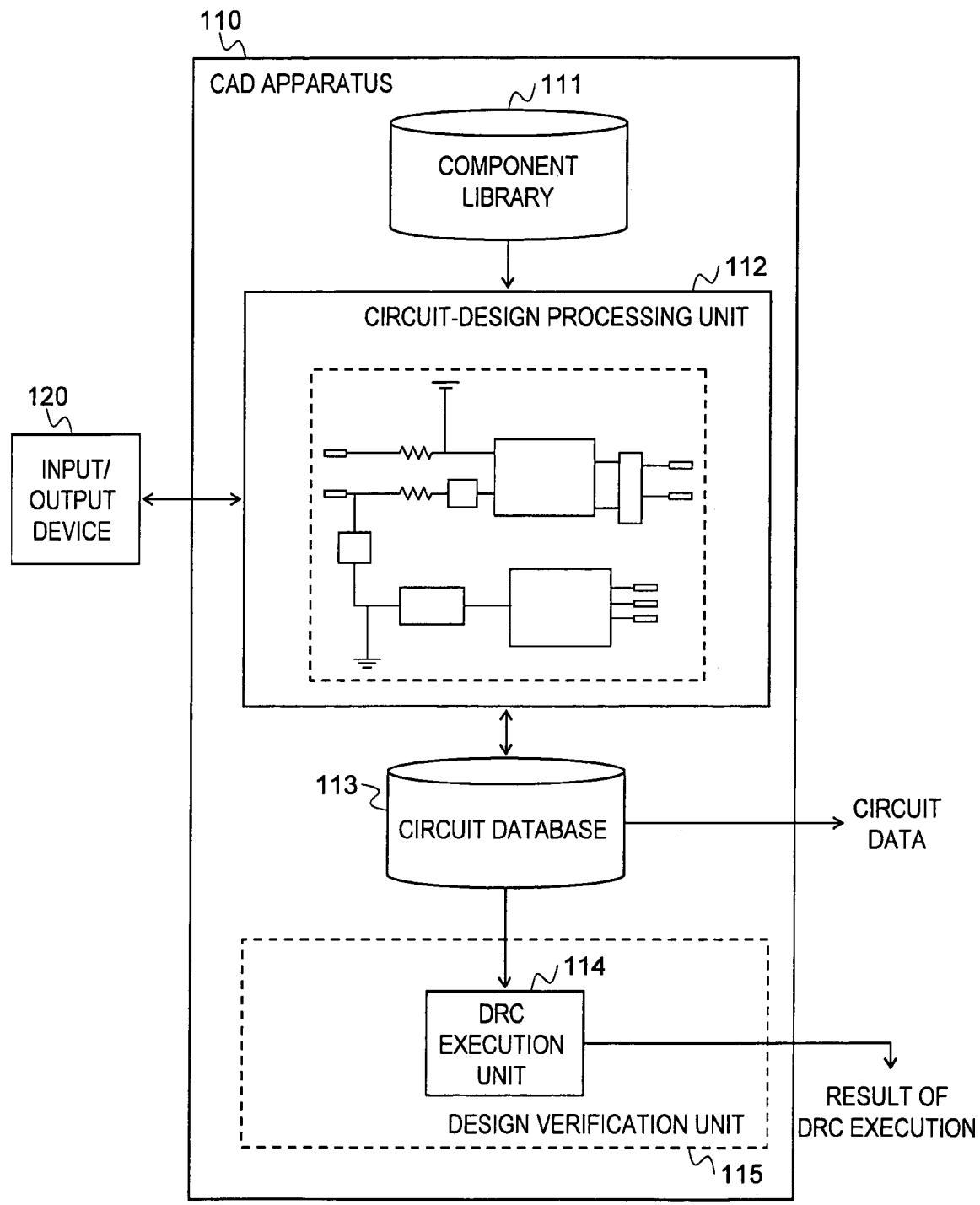
FIG. 20 is a diagram illustrating a configuration example of a CAD apparatus.

An embodiment of the present invention has been explained heretofore; however, the present invention is not limited thereto. For example, in the present embodiment, an example has been described in which the present invention is applied to design verification in the circuit design (P12) illustrated in FIG. 19; however, the present invention can readily be applied to design verification in the mounting design (P14) illustrated in FIG. 19.

What it claimed is:

1. A design verification apparatus for verifying a design of a circuit diagram designed by utilizing circuit data that is data for the designed circuit diagram, the design verification apparatus comprising:
    a determination unit for repeating processes of searching a second component to be connected to a first component in a circuit diagram including network configuration of components and information on each component configured to the circuit diagram, determining whether the second component is a logically transparent component, an input and output of which are logically identical in value, and searching a component to be connected to the second component until the search component is not determined as a logically transparent component, then for extracting the search component that is not determined is a transparent component;
    a data creating unit for creating, based on the circuit diagram, data on a logically transparent net, which represents a configuration of a logical network in which only the extracted components are connected with one another and for creating design-verification data by adding the logically transparent net to the circuit data;
    a storage unit for storing the design-verification data; and
    a verification unit for performing design verification, by tracing the connected components on the logically transparent net of the design-verification data stored in the storage unit.

2. The design verification apparatus according to claim 1, further comprising
    a setting unit for identifying a logical type of each component of part of or all of the circuit diagram, based on the connection configurations of the components and a type of component on the circuit diagram, and for automatically setting the identified logical type in the data of a corresponding component data of the circuit data.

3. A design verification method implemented by a computer of a design verification apparatus for performing design verification of a circuit diagram designed by utilizing circuit data that is data for the designed circuit diagram, the design verification method comprising:
    a step of, by searching, using the computer, a second component to be connected to a first component in a circuit diagram including network configuration of components and information on each component configured to the circuit diagram, determining whether the second component is a logically transparent component, an input and output of which are logically identical in value, and searching a component to be connected to the second component until the search component is not determined as a logically transparent component, then extracting the search component that is not determined is a transparent component, creating data on a logically transparent net, which represents configuration of logical network in which only the extracted components are connected with one another and then creating design-verification data by adding the logically transparent net to the circuit data;
    a step of storing the design-verification data in a design-verification data storing means; and
    a step of performing design verification, by tracing the connected components on the logically transparent net of the design-verification data stored in the storage means.

4. A computer aided design apparatus for supporting a designer to design a circuit diagram, comprising:
    a unit for creating a circuit diagram, in accordance with instructions of a designer;
    a unit for storing circuit data for the created circuit diagram;
    a unit for, by searching a second component to be connected to a first component in a circuit diagram including network configuration of components and information on each component configured to the circuit diagram, determining whether the second component is a logically transparent component, an input and output of which are logically identical in value, and searching a component to be connected to the second component until the search component is not determined as a logically transparent component, then extracting the search component that is not determined is a transparent component, creating data on a logically transparent net, which represents configuration of logical network in which only the extracted components are connected with one another and then creating design-verification data by adding the logically transparent net to the circuit data;
    a unit for storing the design-verification data; and
    a unit for performing design verification, by tracing the connected components on the logically transparent net of the design-verification data stored in the storage unit.

* * * * *

UNITED STATES PATENT AND TRADEMARK OFFICE
CERTIFICATE OF CORRECTION

PATENT NO. : 7,657,853 B2　　　　　　　　　　　　　　　　　　　　　　　　　　　Page 1 of 1
APPLICATION NO. : 11/589170
DATED : February 2, 2010
INVENTOR(S) : Mitsuru Sato et al.

It is certified that error appears in the above-identified patent and that said Letters Patent is hereby corrected as shown below:

Title Page; item 54;
First Page, Column 1 (Title), Line 1, before "VERIFICATION APPARATUS," insert --DESIGN--.

Column 1, Line 1 (Title), before "VERIFICATION APPARATUS," insert --DESIGN--.

Signed and Sealed this

First Day of June, 2010

David J. Kappos
*Director of the United States Patent and Trademark Office*